(12) United States Patent
Oshima et al.

(10) Patent No.: US 10,585,112 B2
(45) Date of Patent: Mar. 10, 2020

(54) ACCELERATION SENSOR

(71) Applicant: HITACHI, LTD., Chiyoda-ku, Tokyo (JP)

(72) Inventors: Takashi Oshima, Tokyo (JP); Yuki Furubayashi, Tokyo (JP)

(73) Assignee: HITACHI, LTD., Tokyo (JP)

( * ) Notice: Subject to any disclaimer, the term of this patent is extended or adjusted under 35 U.S.C. 154(b) by 404 days.

(21) Appl. No.: 15/547,210

(22) PCT Filed: Feb. 17, 2015

(86) PCT No.: PCT/JP2015/054230
§ 371 (c)(1),
(2) Date: Jul. 28, 2017

(87) PCT Pub. No.: WO2016/132447
PCT Pub. Date: Aug. 25, 2016

(65) Prior Publication Data
US 2018/0011125 A1   Jan. 11, 2018

(51) Int. Cl.
  *G01P 15/13*   (2006.01)
  *G01P 15/125*  (2006.01)
  *G01P 15/08*   (2006.01)
  *G01R 15/20*   (2006.01)

(52) U.S. Cl.
  CPC ........ *G01P 15/131* (2013.01); *G01P 15/0802* (2013.01); *G01P 15/125* (2013.01); *G01R 15/20* (2013.01)

(58) Field of Classification Search
  CPC combination set(s) only.
  See application file for complete search history.

(56) References Cited

U.S. PATENT DOCUMENTS

| | | | | |
|---|---|---|---|---|
| 5,510,156 A | * | 4/1996 | Zhao ...................... | B81B 3/001 216/12 |
| 5,583,290 A | * | 12/1996 | Lewis ................... | G01P 15/125 73/514.18 |
| 5,620,931 A | * | 4/1997 | Tsang ..................... | B81B 3/001 216/2 |

(Continued)

*Primary Examiner* — Nathaniel J Kolb
(74) *Attorney, Agent, or Firm* — Miles & Stockbridge, P.C.

(57) ABSTRACT

Provided is an acceleration sensor capable of realizing a simultaneous operation method of signal detection and servo control in place of a time-division processing method, by an MEMS process in which a manufacturing variation is large. The acceleration sensor is an MEMS capacitive acceleration sensor and has capacitive elements for signal detection and capacitive elements for servo control different from the capacitive elements for the signal detection. A voltage to generate force in a direction reverse to a detection signal of acceleration by the capacitive elements for the signal detection is applied to the capacitive elements for the servo control. Further, the acceleration sensor includes a variable capacity unit compensating for a mismatch of capacity values of the capacitive elements for the servo control at an ASIC side, detects a leak signal due to the mismatch of the capacity values in an ASIC, controls a capacity value of the variable capacity unit, on the basis of a detection result, compensates for an influence of the mismatch of the capacity values, and executes a normal signal detection/servo control simultaneous operation.

15 Claims, 20 Drawing Sheets

(56) References Cited

U.S. PATENT DOCUMENTS

| | | | | |
|---|---|---|---|---|
| 5,744,968 | A * | 4/1998 | Czarnocki | G01P 15/131 324/608 |
| 5,852,242 | A * | 12/1998 | Devolk | G01P 1/006 73/514.17 |
| 6,497,149 | B1 * | 12/2002 | Moreau | G01P 15/125 73/514.32 |
| 2008/0011081 | A1 * | 1/2008 | Campbell | G01P 15/125 73/514.17 |
| 2013/0233077 | A1 * | 9/2013 | Chen | G01P 15/125 73/514.18 |
| 2016/0091525 | A1 * | 3/2016 | Oshima | G01P 15/125 73/514.32 |

* cited by examiner

ACCELERATION SENSOR

TECHNICAL FIELD

The present invention relates to an acceleration sensor and particularly, to a micro electromechanical systems (MEMS) capacitive acceleration sensor.

BACKGROUND ART

A sensor for a seismic reflection survey to explore for oil or natural gas excites an artificial earthquake and grasps reflected waves of seismic waves thereof reflected on a stratum as acceleration, after multiple sensors are scattered and disposed to become a predetermined two-dimensional array, on aground surface of the stratum in which resources are predicted to be buried. The sensor for the seismic reflection survey is used to analyze acceleration data received all at once by a group of sensors disposed two-dimensionally, check a state of the stratum, and determine presence or absence of the resources such as the oil and the natural gas. An acceleration sensor for the sensor for the seismic reflection survey is requested to realize both a low noise characteristic enabling detection of an acceleration signal having an extraordinarily low noise as compared with sensors of other fields and low consumption power necessary for controlling multiple sensors at the same time.

An acceleration sensor manufactured using MEMS technology can be miniaturized dramatically as compared with the conventional acceleration sensor and is expected as a solution to realize the above request.

PTL 1 and PTL 2 disclose an MEMS capacitive acceleration sensor that has a structure in which an MEMS capacitive element is used commonly for signal detection and for application of servo force to generate force in a direction reverse to a detection signal and an area is reduced. In this structure, a method of performing signal detection and servo control alternately is used in time-division processing to use the MEMS capacitive element commonly. In the time-division processing, a method of including resetting between the signal detection and the servo control is also used.

CITATION LIST

Patent Literature

PTL 1: U.S. Pat. No. 5,852,242
PTL 2: U.S. Pat. No. 6,497,149

SUMMARY OF INVENTION

Technical Problem

In the time-division processing method described in PTL 1 or PTL 2, there are the following problems.

(1) When the time-division processing is executed, an internal operation speed doubles (the method of performing the signal detection and the servo control alternately) or quadruples (the method of including the resetting between the signal detection and the servo control) to maintain a signal processing band. For this reason, consumption power of an analog circuit such as an amplifier, a filter, and an A/D converter, a logic circuit, and a servo control unit (D/A converter) may double or quadruple.

(2) When time-division switching is performed, a sampling noise (kT/C noise; k is a Boltzmann constant) is generated by a switching operation for switching and a noise density increases. This is a theoretical phenomenon and is not avoided. As a result, a noise of sensor increases.

(3) When the time-division processing is executed, it is necessary to increase a servo voltage or increase an MEMS capacity value for servo to secure effective servo force. In the case of the former, a design of a high-voltage low-noise circuit is difficult or is originally impossible due to a breakdown voltage of a MOS transistor of a semiconductor process. In the case of the latter, a merit of reducing an area by sharing the MEMS capacity for the detection and the servo by the time-division processing may be lost.

An object of the present invention is to resolve the problems of the time-division processing method described above and provide an acceleration sensor for realizing a simultaneous operation method of signal detection and servo control in place of the time-division processing method, thereby realizing a novel acceleration sensor of low consumption power and a low noise. Particularly, emphasis is placed on compensating for a mismatch of capacity values between MEMS capacitive elements, such that the acceleration sensor can be realized by an MEMS process in which a manufacturing variation is large. As a result, effects of (1) applicability of a low-cost MEMS process using a cheap manufacturing device and (2) improvement of a yield of an MEMS sensor can be expected and productivity can be improved.

The above and other object and novel characteristics of the present invention will be apparent from the description of the present specification and the accompanying drawings.

Solution to Problem

To resolve the above problems, in the present invention, an MEMS capacitive acceleration sensor is configured to include a first MEMS capacitor pair for signal detection; a second MEMS capacitor pair for servo control in which one electrode of each capacitor is connected to one electrode of each capacitor in the first capacitor pair and to which a servo voltage to generate force in a direction reverse to a detection signal of acceleration by the first MEMS capacitor pair is applied; a charge amplifier which is connected to electrodes of the first MEMS capacitor pair and the second MEMS capacitor pair connected to each other and forming one weight and converts a charge change on the weight into a voltage change; an A/D converter which digitizes a voltage change signal of an output of the charge amplifier; a 1-bit quantizer which quantizes a servo value to generate force in a direction reverse to displacement of the weight by the acceleration, generated from an output of the A/D converter, with 1 bit; a 1-bit D/A converter which converts an output of the 1-bit quantizer into an analog servo voltage and applies the analog servo voltage to the second MEMS capacitor pair; a correlation detection unit which correlates the output of the A/D converter and the output of the 1-bit quantizer and outputs a signal proportional to a mismatch $\Delta C$ of capacity values in the second MEMS capacitor pair; a control unit which outputs a capacity control value to cancel an influence by the mismatch $\Delta C$ of the capacity values on an input node of the charge amplifier, on the basis of the output of the correlation detection unit; and a variable capacity unit which is inserted between an output node of a driver outputting the output of the 1-bit quantizer at voltage amplitude more suppressed than amplitude of the servo voltage and the input node of the charge amplifier and of which a capacity is controlled according to the capacity control value of the output of the control unit.

In addition, to resolve the above problems, in the present invention, an MEMS capacitive acceleration sensor is configured to include a first MEMS capacitor pair for signal detection; a second MEMS capacitor pair for servo control in which one electrode of each capacitor is connected to one electrode of each capacitor in the first capacitor pair to configure a positive-side weight (movable electrode portion) and to which a servo voltage to generate force in a direction reverse to a detection signal of acceleration by the first MEMS capacitor pair is applied; a third MEMS capacitor pair for signal detection; a fourth MEMS capacitor pair for servo control in which one electrode of each capacitor is connected to one electrode of each capacitor in the third capacitor pair to configure a negative-side weight (movable electrode portion) and to which a servo voltage to generate force in a direction reverse to a detection signal of acceleration by the third MEMS capacitor pair is applied; a first charge amplifier which is connected to the positive-side weight and converts a charge change on the positive-side weight into a voltage change; a second charge amplifier which is connected to the negative-side weight and converts a charge change on the negative-side weight into a voltage change; an A/D converter which digitizes voltage change signals of differential outputs of the first and second charge amplifiers; a 1-bit quantizer which quantizes a servo value to generate force in a direction reverse to displacement of the weight by the acceleration, generated from an output of the A/D converter, with 1 bit; a 1-bit D/A converter which converts an output of the 1-bit quantizer into an analog servo voltage and applies the analog servo voltage to the second MEMS capacitor pair and the fourth MEMS capacitor pair; a correlation detection unit which correlates the output of the A/D converter and the output of the 1-bit quantizer and outputs a signal proportional to a mismatch ΔC of capacity values in the second MEMS capacitor pair and the fourth MEMS capacitor pair; a control unit which outputs differential capacity control values to cancel an influence by the mismatch ΔC of the capacity values on input nodes of the first and second charge amplifiers, on the basis of the output of the correlation detection unit; a first variable capacity unit which is inserted between an output node of a driver outputting the output of the 1-bit quantizer at voltage amplitude more suppressed than amplitude of the servo voltage and the input node of the first charge amplifier and of which a capacity is controlled according to the differential capacity control values of the output of the control unit; and a second variable capacity unit which is inserted between the output node of the driver outputting the output of the 1-bit quantizer at the voltage amplitude more suppressed than the amplitude of the servo voltage and the input node of the second charge amplifier and of which a capacity is controlled according to the differential capacity control values of the output of the control unit.

Advantageous Effects of Invention

According to a representative effect of the invention disclosed in the present application, an acceleration sensor for realizing a simultaneous operation method of signal detection and servo control in place of a time-division processing method can be provided by an MEMS process in which a manufacturing variation is large.

DESCRIPTION OF EMBODIMENTS

Figure 1:
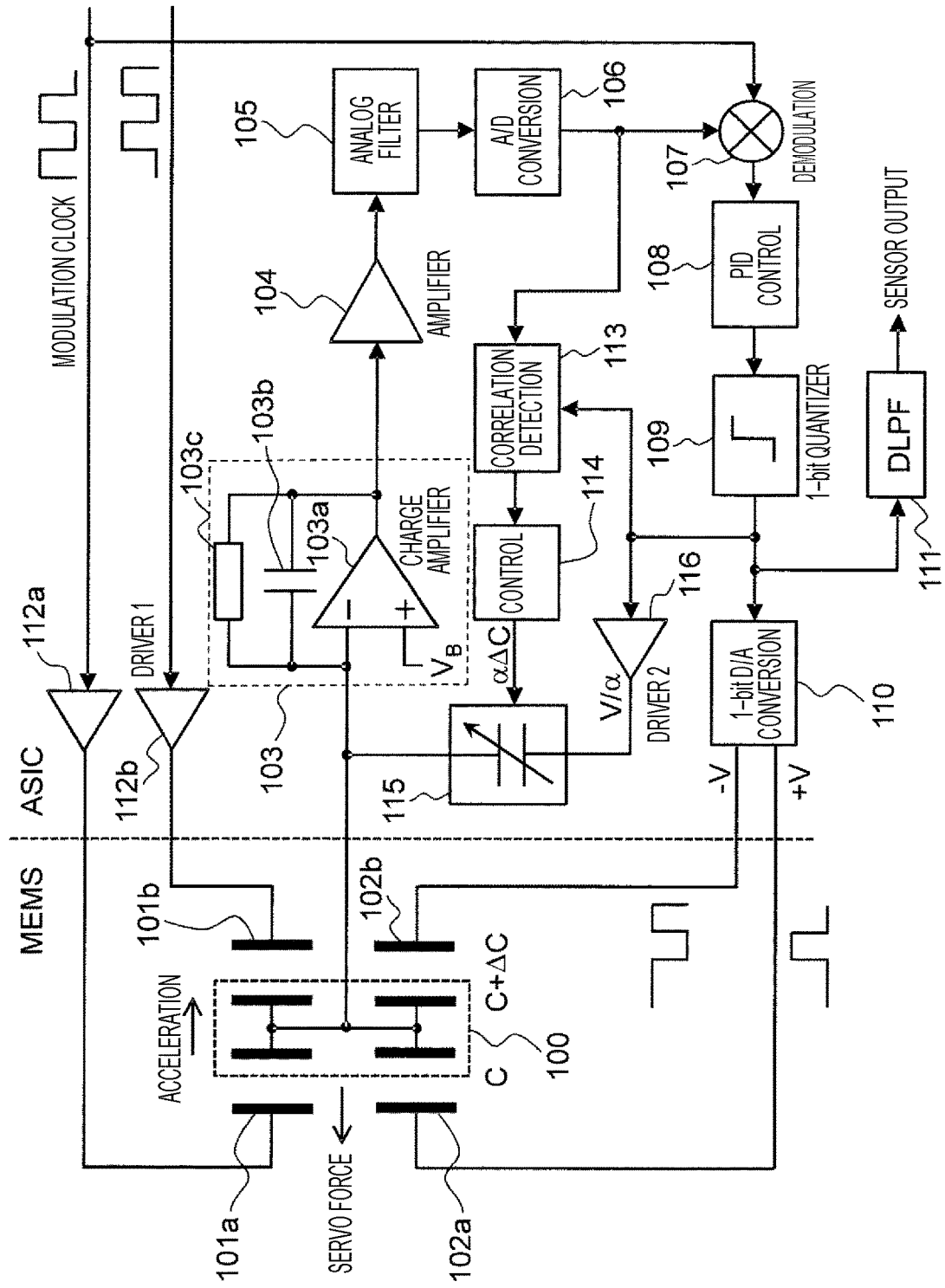
FIG. 1 is a diagram illustrating an example of a configuration of an acceleration sensor according to a first embodiment of the present invention.

In embodiments described below, the invention will be described in a plurality of sections or embodiments when required as a matter of convenience. However, these sections or embodiments are not irrelevant to each other unless otherwise stated and one relates to the entire or part of the other as a modification, details, or a supplementary explanation thereof. In addition, in the embodiments described below, when referring to the number of elements (including the number of pieces, values, amounts, ranges, and the like), the number of the elements is not limited to a specific number unless otherwise stated or except for the case in which the number is apparently limited to a specific number in principle and the number larger or smaller than the specified number is also applicable.

In addition, in the embodiments described below, it goes without saying that components (including element steps and the like) are not always indispensable unless otherwise stated or except for the case in which the components are apparently indispensable in principle. Similarly, in the embodiments described below, when shapes of the components, a positional relation thereof, and the like are mentioned, the substantially approximate and similar shapes and the like are included therein unless otherwise stated or except for the case in which it is conceivable that they are not apparently excluded in principle. The same is applicable to the numerical values and the ranges described above.

Hereinafter, the individual embodiments based on the outlines of the embodiments will be described in detail on the basis of the drawings. Throughout the drawings illustrating the embodiments, the same members are denoted with the same reference numerals or associated reference numerals in principle and repetitive description thereof is omitted. In addition, in the embodiments described below, description of the same or equivalent portions is not repeated in principle, except for when necessary in particular.

First Embodiment

An acceleration sensor according to a first embodiment will be described using FIG. 1. FIG. 1 is a diagram illustrating an example of a configuration of the acceleration sensor.

In the acceleration sensor, a mechanical portion is configured using micro electro mechanical systems (MEMS) and a circuit portion is configured using an application specific integrated circuit (ASIC). The acceleration sensor is not limited thereto. For example, the acceleration sensor is used for an MEMS capacitive acceleration sensor detecting vibration acceleration extremely smaller than gravity, as a sensor for a seismic reflection survey to explore for oil or natural gas.

First, a configuration will be described. The MEMS includes a capacitor pair 101a and 101b for signal detection and a capacitor pair 102a and 102b for servo control. One electrode of each of the four capacitors is connected mechanically and electrically and forms one weight (movable electrode portion) 100. The weight is connected to an inversion input terminal of an operational amplifier 103a configuring a charge amplifier 103. The charge amplifier 103 is configured using the operational amplifier 103a, a feed-back capacitor 103b, and a feedback resistor 103c. A bias voltage $V_B$ is connected to a non-inversion input terminal of the operational amplifier 103a. $V_B$ may be a ground potential or may not be the ground potential. An output (that is, an output of the operational amplifier 103a) of the charge amplifier 103 is input to an amplifier 104, an output of the amplifier 104 is input to an analog filter 105, and an output of the analog filter 105 is input to an A/D converter 106. An output of the A/D converter 106 is input to a demodulator 107. A modulation clock is also input to the demodulator 107. An output of the demodulator 107 is input to a servo control unit 108, an output of the servo control unit 108 is input to a 1-bit quantizer 109, and an output of the 1-bit quantizer 109 is input to a 1-bit D/A converter 110. Differential outputs of the 1-bit D/A converter 110 are connected to electrodes (electrodes not configuring the weight) of the capacitor pair 102a and 102b for the servo control, respectively. In addition, the modulation clock and an inversion clock thereof are input to drivers 112a and 112b for the capacitor pair for the signal detection, respectively, and outputs of the drivers are connected to electrodes (electrodes not configuring the weight) of the capacitor pair 101a and 101b for the signal detection, respectively. The output of the A/D converter 106 is input to a correlation detection unit 113 and the output of the 1-bit quantizer 109 is also input to the correlation detection unit 113. An output of the correlation detection unit 113 is input to a control unit 114 and an output of the control unit 114 functions as a control signal and controls a capacity value of a variable capacity unit 115. The output of the 1-bit quantizer 109 is also input to a driver 116 for a variable capacity and an output of the driver 116 for the variable capacity is connected to one terminal of the variable capacity unit 115. The other terminal of the variable capacity unit 115 is connected to the weight (movable electrode portion) 100 (that is, the inversion input terminal of the operational amplifier 103a). In addition, the output of the 1-bit quantizer 109 is input to a digital low-pass filter 111 and an output of the digital low-pass filter 111 becomes an output of the acceleration sensor. The ASIC includes elements from the charge amplifier 103 to the 1-bit D/A converter 110. The variable capacity unit 115 is also mounted in the ASIC.

Next, an operation will be described. If acceleration is applied from the outside to the acceleration sensor, inertial force is generated in the weight 100 to be moved. As a result, the weight 100 is displaced. Since the weight 100 is also the electrodes of the capacitor pair 101a and 101b for the signal detection, capacity values of the capacitor pair are changed by the displacement. For example, in FIG. 1, if the acceleration is applied in a rightward direction and the weight 100 is displaced in the rightward direction, a distance between the movable electrode (that is, the weight 100) of the capacitor 101b for the signal detection and a fixed electrode thereof decreases and a capacity change value of $+\Delta C_D$ is obtained and a distance between the movable electrode (that is, the weight 100) of the capacitor 101a for the signal detection and a fixed electrode thereof increases and a capacity change value of $-\Delta C_D$ is obtained. An application direction and an amount of the acceleration can be detected on the basis of the capacity change values ($+\Delta C_D$ and $-\Delta C_D$) in the capacitor pair 101a and 101b for the signal detection. A pair structure of the capacitor pair 101a and 101b for the detection is a structure for various known objects not described in detail, for example, for canceling in-phase components of the capacity values. For the convenience of description, parallel plate capacitors are used in the MEMS configuration in the above description and FIG. 1. However, the same mechanism is realized in other types of capacitors. Therefore, the present invention is not limited to the MEMS of the parallel plate capacitor type.

A modulation clock voltage and an inversion clock voltage thereof are applied to the capacitor pair 101a and 101b for the detection via the drivers 112a and 112b for the capacitor pair for the signal detection, respectively. As a result, the capacity change of $\Delta C_D$ is converted into a charge change. The charge change is converted into a voltage change by the charge amplifier 103 of an initial step in the ASIC. The charge amplifier 103 has a configuration of a so-called operational amplifier inversion amplifier of a capacitive type and input capacitors are the capacitor pair 101a and 101b for the signal detection at the MEMS side and a feedback capacitor is the feedback capacitor 103b at the ASIC side. However, the feedback resistor 103c having a high resistance value is inserted into a feedback path in parallel. This is to secure a direct-current feed path to compensate for an input leak current of the operational amplifier 103a. Meanwhile, measures using a reset switch in a portion of the feedback resistor 103c are known conventionally. However, in this case, there is a problem in that a noise density of a sampling noise by the reset switch is high. Since a thermal noise by the feedback resistor 103c having the high resistance value used in this method is sufficiently suppressed in the vicinity of a desired frequency (that is, a frequency of the modulation clock), by a low-pass filter characteristic by the feedback resistor 103c and the feedback capacitor 103b, there is no problem.

A signal converted into a voltage by the charge amplifier 103 is amplified by the amplifier 104, a noise or an unnecessary signal component thereof is suppressed by the analog filter 105, and the signal is converted into a digital value by the A/D converter 106. The demodulator 107 is a digital multiplier of two inputs and multiplies the output of the A/D converter 106 and the modulation clock and performs synchronous detection for the modulation clock. As a result, a value proportional to the displacement of the weight 100 is obtained in an output of the demodulator 107. A series of modulation/demodulation processing is equivalent to a so-called "chopper system". As a result, an influence by a loud 1/f noise generated by the charge amplifier 103, the amplifier 104, the analog filter 105, and the A/D converter 106 can be avoided. The servo control unit 108 is a circuit that receives the displacement value of the weight 100 demodulated by the demodulator 107, determines a servo value to generate force in a direction reverse to a detection signal, on the basis of the value, and outputs the servo value to the 1-bit quantizer 109. Particularly, a digital integration operation may be included in signal processing in the servo control unit 108 and control may be performed such that the displacement of the weight 100 becomes zero.

As a result, because the capacity value changes of the capacitor pair 101a and 101b for the signal detection are minimized, linearity of the acceleration sensor can be increased. (That is, because the servo force is applied to almost cancel the displacement of the weight and the displacement of the weight remains in an extremely narrow range, detection is enabled in a region where a relation of the acceleration and the displacement shows the linearity).

In addition, a differentiation (or difference) operation may be included in the signal processing in the servo control unit 108, phase compensation may be performed, and a servo control loop may be stabilized. At this time, logic of general PID control can be applied.

The 1-bit quantizer 109 quantizes the servo value determined and output by the servo control unit 108 with 1 bit.

For example, if an input of the 1-bit quantizer 109 is 0 or more, the 1-bit quantizer 109 outputs +1 and if the input is negative, the 1-bit quantizer 109 outputs −1. The 1-bit D/A converter 110 receives a digital value (±1) of 1 bit quantized by the 1-bit quantizer 109, converts the digital value into an analog voltage (for example, ±5 V or 10 V/0 V), and applies the analog voltage to the fixed electrodes of the capacitor pair 102a and 102b for the servo control. As a result, electrostatic force in a direction reverse to the detected acceleration signal can be applied to the weight 100. In a steady state, net force acting on the weight 100 and the displacement of the weight 100 become almost zero. As such, the 1-bit quantizer 109 is inserted, so that the subsequent D/A converter can be configured as the 1-bit D/A converter 110. Since the 1-bit D/A converter is easily mounted in terms of a circuit, the 1-bit D/A converter is advantageous to low consumption power. In addition, a capacity unit for servo control can be simplified. In the output of the 1-bit quantizer 109, because a high frequency component (that is, a quantization error noise-shaped (diffused) to a high frequency side by sigma-delta control of a servo loop) is suppressed by the digital low-pass filter 111, a final output of the acceleration sensor can be made to have a low noise. By the above configuration, in this acceleration sensor, the signal detection and the servo control are performed at the same time.

In the present invention, an output signal of the A/D converter 106 and an output signal of the 1-bit quantizer 109 are correlated by the correlation detection unit 113. This is to detect a mismatch $\Delta C$ of capacity values in the capacitor pair 102a and 102b for the servo control. If $\Delta C$ exists, a servo leak signal proportional to $\Delta C$ is generated in the output of the charge amplifier 103, the servo leak signal is amplified hereinafter by the amplifier 104, a high frequency component of the servo leak signal is suppressed to a certain degree by the analog filter 105, and the servo leak signal is converted into a digital value by the A/D converter 106. The same waveform as a waveform of an output signal of the 1-bit quantizer 109 and an inversion waveform thereof are differentially applied to the capacitor pair 102a and 102b for the servo control via the 1-bit D/A converter 110. For this reason, the servo leak signal has almost the same waveform as the waveform of the output signal of the 1-bit quantizer 109. That is, the servo leak signal is proportional to $\Delta C$ and has the same waveform as the waveform of the output signal of the 1-bit quantizer 109. Focusing on the above fact, the servo leak signal included in the output of the A/D converter 106 can be detected. To do this, the output signal of the A/D converter 106 and the output signal of the 1-bit quantizer 109 are correlated in the correlation detection unit 113, as described above. As a result, a direct-current or low frequency signal proportional to $\Delta C$ can be included in the output of the correlation detection unit 113. Therefore, the subsequent control unit 114 executes a digital integration operation or a phase compensation operation according to necessity, with respect to the output signal of the correlation detection unit 113, and determines and outputs a capacity control value. The capacity control value is a digital value. Thereby, a capacity value of the variable capacity unit 115 is controlled. An object of the variable capacity unit 115 is to cancel an influence by $\Delta C$ on an input node (that is, an inversion input terminal node of the operational amplifier 103a) of the charge amplifier 103. To do this, it is considered that a capacitor of the same capacity value as the mismatch $\Delta C$ of the capacitor pair 102a and 102b for the servo control is inserted between the node and one output of the 1-bit D/A converter 110. However, this method has two problems.

First, the output of the 1-bit D/A converter 110 has high voltage amplitude of about 10 V. For this reason, when a voltage amplitude level is input to the variable capacity unit 115 mounted in the ASIC as it is, a waveform may be clipped by an electrostatic discharge damage protection element (ESD element) connected to the input terminal of the ASIC to do so. Finally, a desired voltage is not transmitted to the variable capacity unit 115. In this acceleration sensor, because a semiconductor process of a low voltage is applied to the ASIC for low consumption power, an input voltage range in which the clipping is not generated is smaller than output amplitude of the 1-bit D/A converter 110. For this reason, the waveform clipping is generated.

Second, in the case of the above method, it may be necessary to adjust the capacity values to the same capacity values with extremely high precision. For example, in the case in which $\Delta C$ is the mismatch of about 1% and it is necessary to cancel $\Delta C$ with precision of 0.01%, if it is assumed that the capacity values of the capacitor pair 102a and 102b for the servo control are 5 pF, a variable capacity unit capable of being controlled with 5 pF×0.01/100=0.5 fF increments is necessary. Capacity value increment precision is unrealistic in view of processing dimension precision of a semiconductor process or a parasitic capacity value.

Therefore, in the present invention, a lower end of the variable capacity unit 115 is connected to the output of the driver 116 for the variable capacity, not the output of the 1-bit D/A converter 110. The output of the 1-bit D/A converter 110 has high voltage amplitude (for example, ±5 V or 10 V/0 V) to generate sufficient electrostatic force. However, the driver 116 for the variable capacity is inserted, so that output amplitude of the output signal of the driver 116 for the variable capacity can be decreased while the output signal is made to have the same waveform (that is, the same waveform as the waveform of the output signal of the 1-bit quantizer 109) as the waveform of the output signal of the 1-bit D/A converter 110. For example, if the output voltage amplitude of the 1-bit D/A converter 110 is set to ±V and the output amplitude of the driver 116 for the variable capacity is set to V/α (α>1), a capacity value necessary for canceling error charges generated by $\Delta C$ is $\alpha \Delta C$ and can be multiplied by α. That is, the capacity value increment precision can also be multiplied by α. For example, α=20 is set, so that the capacity value increment precision needed in the previous example increases from 0.5 fF to 10 fF. It can be considered that the variable capacity unit 115 of the capacity value increment precision of the above degree can be sufficiently realized by a realistic semiconductor process.

Even when the servo leak signal is weak, the servo leak signal disturbs the servo loop remarkably and causes a noise increase or an unjust oscillation. For this reason, it is absolutely necessary to cancel the influence of the mismatch $\Delta C$ in the capacitor pair 102a and 102b for the servo control with high precision, as described above. An integration operation is included in the control unit 114, so that negative feedback control can be executed such that $\Delta C$ and the servo leak signal become zero. A negative feedback control loop is hereinafter called an "MEMS capacity compensation loop".

In addition, the acceleration sensor can be configured by using a 1.5-bit (three values) quantizer or a multi-bit quantizer in place of the 1-bit quantizer 109 according to this embodiment and using a 1.5-bit (three values) D/A converter or a multi-bit D/A converter in place of the 1-bit D/A converter 110.

Effect of First Embodiment

As described above, according to the acceleration sensor in the first embodiment, the signal detection and the servo control are performed at the same time and the servo leak signal according to the mismatch of the capacity values of the MEMS capacitive elements can be canceled with high precision. Therefore, the noise increase or the unjust oscillation according to the servo leak signal can be prevented. For this reason, even when an MEMS process in which a manufacturing variation is large is used, a capacitive MEMS acceleration sensor of a low noise and low consumption power can be realized. The servo leak signal can be canceled by a digital operation subject to be easily mounted and a dedicated A/D converter is not necessary.

Second Embodiment

Figure 2:
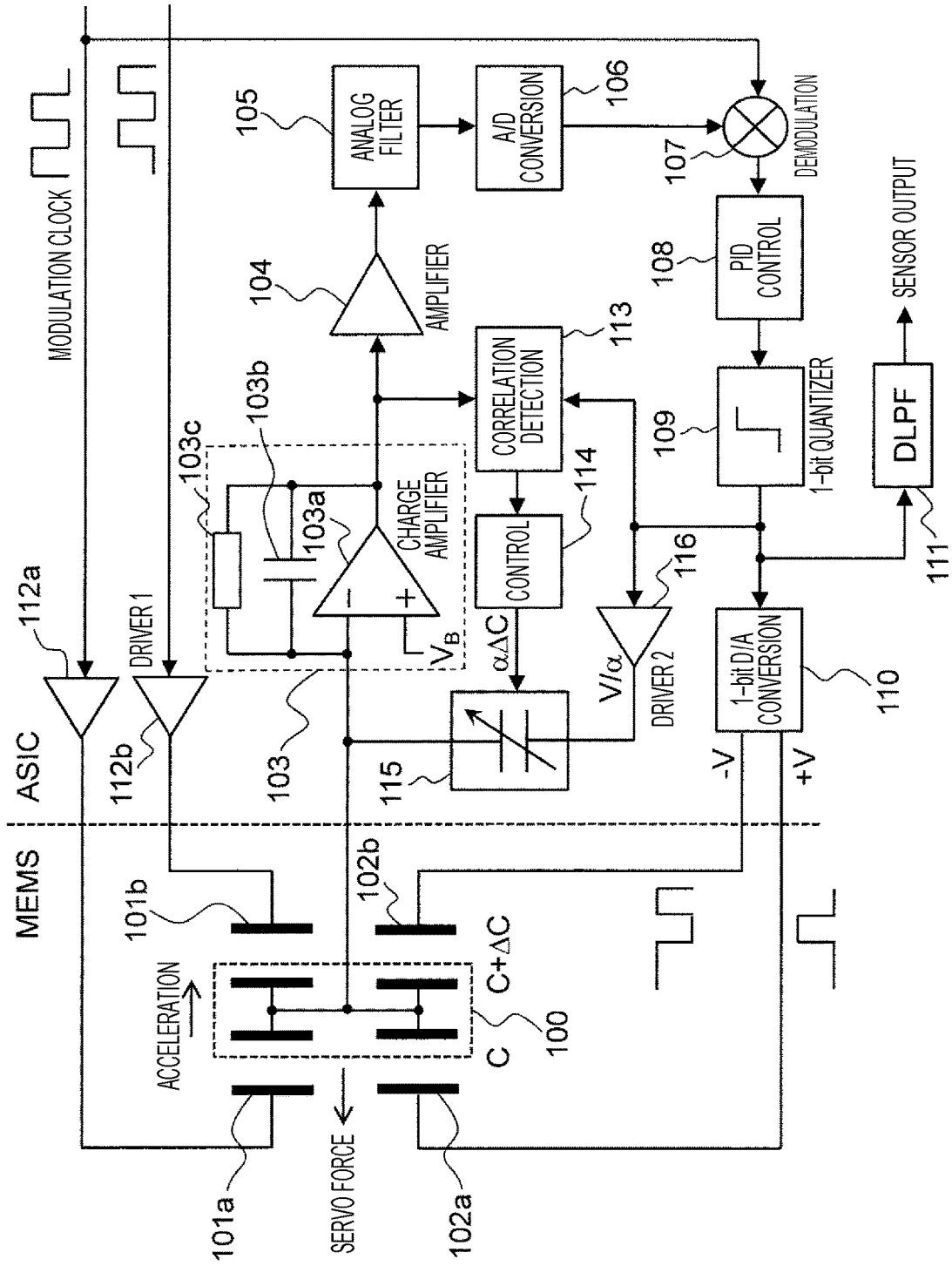
FIG. 2 is a diagram illustrating an example of a configuration of an acceleration sensor according to a second embodiment of the present invention.

FIG. 2 illustrates a second embodiment of the present invention. Since a basic portion of this embodiment is the same as that of the first embodiment, a difference with the first embodiment will be described. In this embodiment, a correlation detection unit 113 is connected to an output of a charge amplifier 103, not an output of an A/D converter 106, as in the first embodiment. For this reason, the correlation detection unit 113 correlates a servo leak signal included in the output of the charge amplifier 103 with an output signal of a 1-bit quantizer 109 and detects the servo leak signal. Differently from the first embodiment of the present invention, the servo leak signal of the output of the charge amplifier 103 is detected directly not via an amplifier 104, an analog filter 105, and the A/D converter 106. Therefore, because there is no delay of the servo leak signal by each analog circuit block, an MEMS capacity compensation loop is easily stabilized and a parameter design of a control unit 114 is facilitated. Instead, a point that it is necessary to realize the correlation detection unit 113 with an analog circuit and a point that an A/D converter is necessary separately in the control unit 114 become demerits as compared with the first embodiment.

Effect of Second Embodiment

As described above, according to an acceleration sensor in the second embodiment, signal detection and servo control are performed at the same time and the servo leak signal according to a mismatch of capacity values of MEMS capacitive elements can be canceled with high precision. Therefore, a noise increase or an unjust oscillation according to the servo leak signal can be prevented. For this reason, even when an MEMS process in which a manufacturing variation is large is used, a capacitive MEMS acceleration sensor of a low noise and low consumption power can be realized. Since the servo leak signal of the output of the charge amplifier is directly detected, a stabilization design is easy.

Third Embodiment

Figure 3:
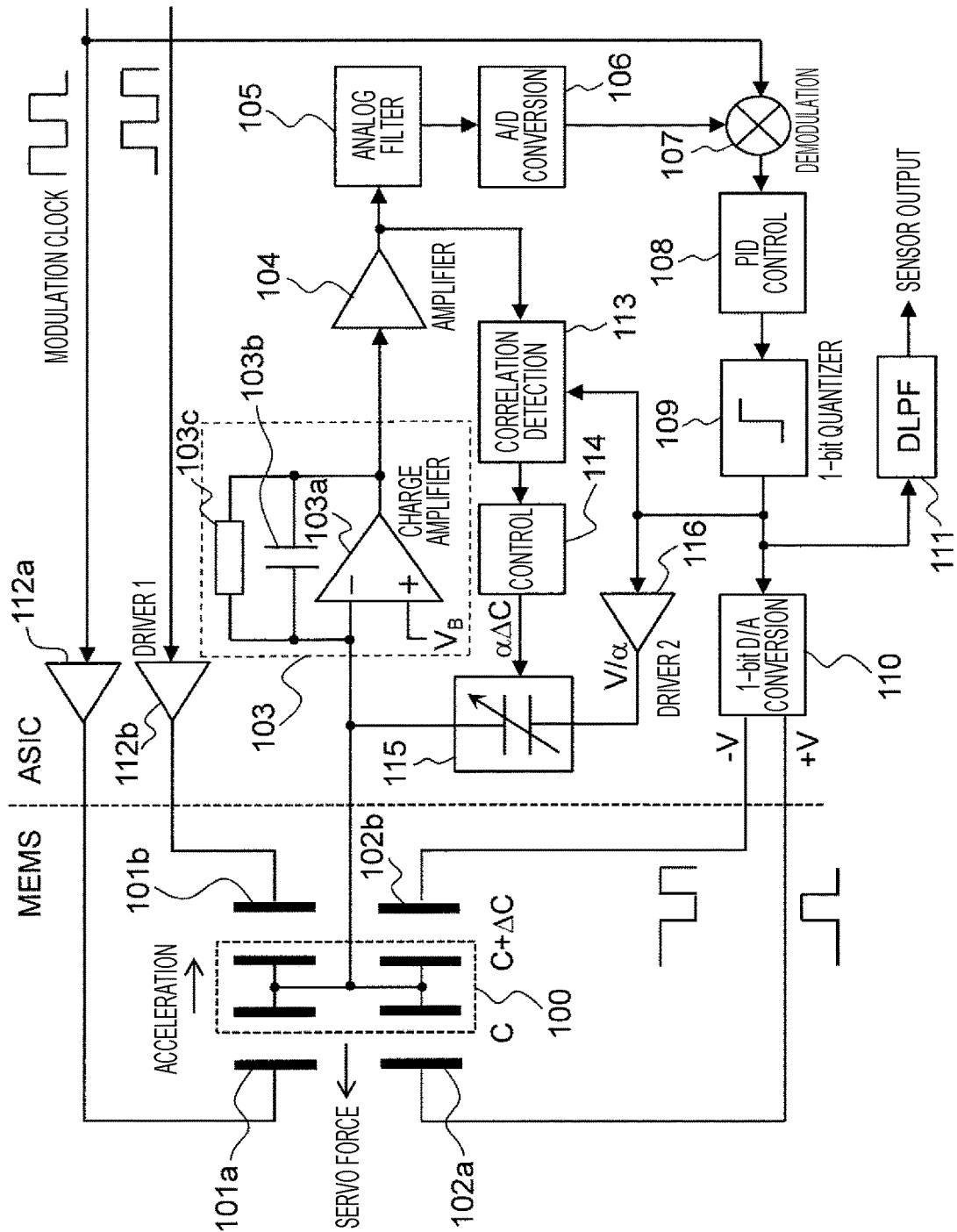
FIG. 3 is a diagram illustrating an example of a configuration of an acceleration sensor according to a third embodiment of the present invention.

FIG. 3 illustrates a third embodiment of the present invention. Since a basic portion of this embodiment is the same as that of the first embodiment, a difference with the first embodiment will be described. In this embodiment, a correlation detection unit 113 is connected to an output of an amplifier 104, not an output of an A/D converter 106, as in the first embodiment. For this reason, the correlation detection unit 113 correlates a servo leak signal included in the output of the amplifier 104 with an output signal of a 1-bit quantizer 109 and detects the servo leak signal. Therefore, a delay amount of the servo leak signal is small as compared with the case of the first embodiment and a parameter design of a control unit 114 is facilitated. In addition, because the servo leak signal is amplified by gain of the amplifier 104, a noise specification required in the correlation detection unit 113 or the control unit 114 can be alleviated as compared with the case of the second embodiment.

Effect of Third Embodiment

As described above, according to an acceleration sensor in the third embodiment, signal detection and servo control are performed at the same time and the servo leak signal according to a mismatch of capacity values of MEMS capacitive elements can be canceled with high precision. Therefore, a noise increase or an unjust oscillation according to the servo leak signal can be prevented. For this reason, even when an MEMS process in which a manufacturing variation is large is used, a capacitive MEMS acceleration sensor of a low noise and low consumption power can be realized.

Fourth Embodiment

Figure 4:
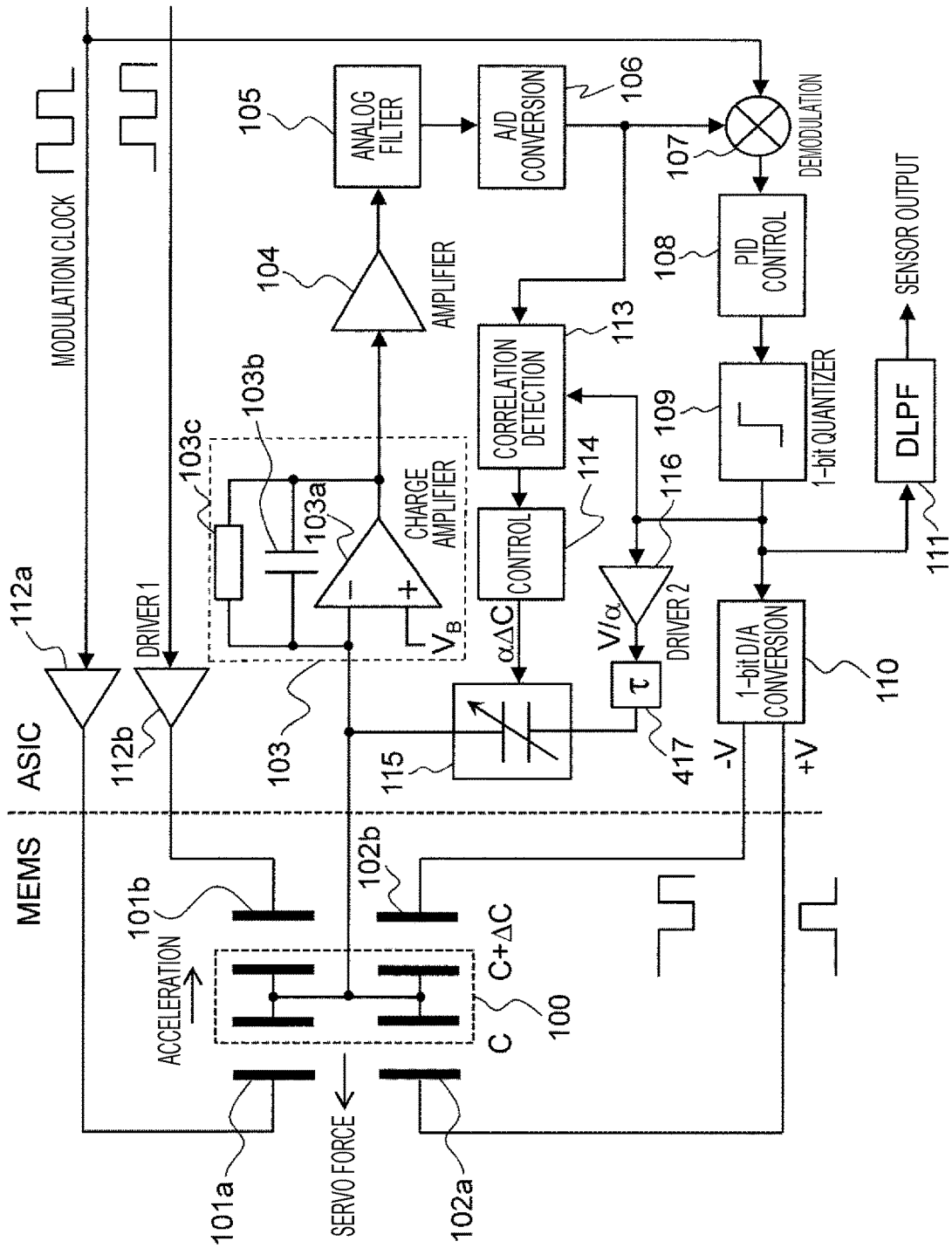
FIG. 4 is a diagram illustrating an example of a configuration of an acceleration sensor according to a fourth embodiment of the present invention.

FIG. 4 illustrates a fourth embodiment of the present invention. Since a basic portion of this embodiment is the same as that of the first embodiment, a difference with the first embodiment will be described. In this embodiment, a delay unit 417 is inserted between a driver 116 for a variable capacity and a variable capacity unit 115. An object of the delay unit 417 is to simulate a response delay due to a limitation of the driving capability of a 1-bit D/A converter 110. The response delay of the 1-bit D/A converter 110 is determined by a time constant to be a product of output resistance thereof and capacity values of capacitors 102a and 102b for servo control and becomes a primary low-pass filter characteristic. Therefore, the delay unit 417 is configured as a primary low-pass filter having almost the same time constant, so that an output waveform of the 1-bit D/A converter 110 can be simulated. As a result, cancellation of the servo leak signal disclosed in the first embodiment can be performed completely.

Effect of Fourth Embodiment

As described above, according to an acceleration sensor in the fourth embodiment, signal detection and servo control are performed at the same time and a servo leak signal according to a mismatch of capacity values of MEMS capacitive elements can be canceled with high precision. Therefore, a noise increase or an unjust oscillation according to the servo leak signal can be prevented. For this reason, even when an MEMS process in which a manufacturing variation is large is used, a capacitive MEMS acceleration sensor of a low noise and low consumption power can be realized. Since delay compensation of the 1-bit D/A converter is performed by the delay unit, the servo leak signal can be canceled with higher precision.

Fifth Embodiment

Figure 5:
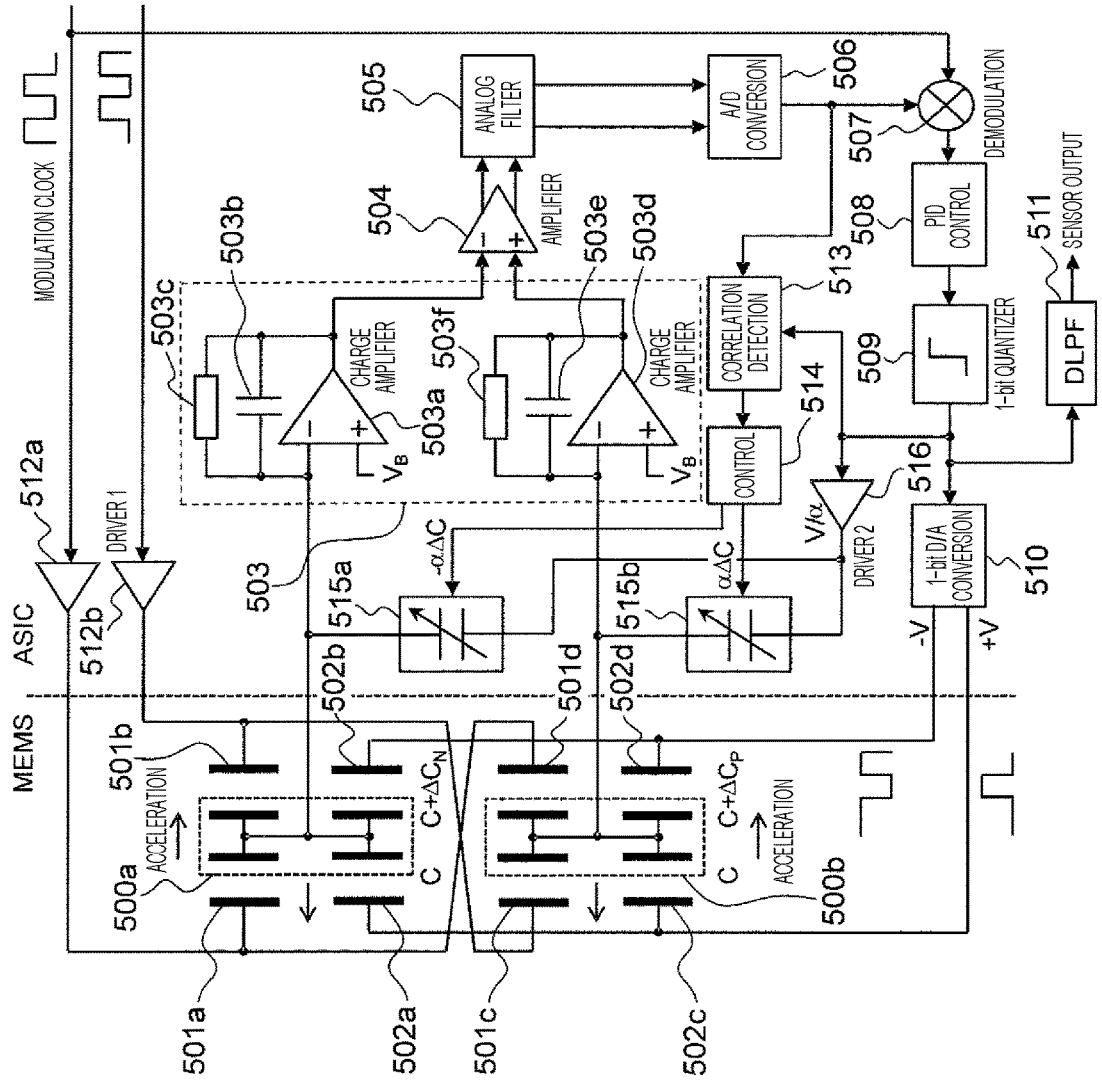
FIG. 5 is a diagram illustrating an example of a configuration of an acceleration sensor according to a fifth embodiment of the present invention.

An acceleration sensor according to a fifth embodiment will be described using FIG. 5. FIG. 5 is a diagram illustrating an example of a configuration of the acceleration sensor. The fifth embodiment corresponds to the case in which the first embodiment of the present invention is applied to a "differential MEMS" configuration.

In the acceleration sensor, a mechanical portion is configured using micro electro mechanical systems (MEMS) and a circuit portion is configured using an application specific integrated circuit (ASIC). The acceleration sensor is not limited thereto. For example, the acceleration sensor is used for an MEMS capacitive acceleration sensor detecting vibration acceleration extremely smaller than gravity, as a sensor for a seismic reflection survey to explore for oil or natural gas.

First, a configuration will be described. The MEMS includes a capacitor pair 501a and 501b for positive-side signal detection, a capacitor pair 501c and 501d for negative-side signal detection, a capacitor pair 502a and 502b for positive-side servo control, and a capacitor pair 502c and 502d for negative-side servo control. One electrode of each of the four capacitors 501a, 501b, 502a, and 502b is connected mechanically and electrically and forms a positive-side weight (movable electrode portion) 500a. In addition, one electrode of each of the four capacitors 501c, 501d, 502c, and 502d is connected mechanically and electrically and forms a negative-side weight (movable electrode portion) 500b. The positive-side weight 500a is connected to an inversion input terminal of an operational amplifier 503a configuring a differential charge amplifier 503. A positive side of the differential charge amplifier 503 is configured using the operational amplifier 503a, a feedback capacitor 503b, and a feedback resistor 503c. A bias voltage $V_B$ is connected to a non-inversion input terminal of the operational amplifier 503a. $V_B$ may be a ground potential or may not be the ground potential. Likewise, a negative side of the differential charge amplifier 503 is configured using an operational amplifier 503d, a feedback capacitor 503e, and a feedback resistor 503f.

Differential outputs (that is, an output of the operational amplifier 503a and an output of the operational amplifier 503d) of the differential charge amplifier 503 are input to a differential amplifier 504, outputs of the differential amplifier 504 are input to a differential analog filter 505, and outputs of the differential analog filter 505 are input to a differential A/D converter 506. An output of the differential A/D converter 506 is input to a demodulator 507. A modulation clock is also input to the demodulator 507. An output of the demodulator 507 is input to a servo control unit 508, an output of the servo control unit 508 is input to a 1-bit quantizer 509, and an output of the 1-bit quantizer 509 is input to a 1-bit D/A converter 510. A positive side of differential outputs of the 1-bit D/A converter 510 is connected to electrodes (electrodes not configuring the weight) of the capacitor 502a for the positive-side servo control and the capacitor 502c for the negative-side servo control. Meanwhile, a negative side of the differential outputs of the 1-bit D/A converter 510 is connected to electrodes (electrodes not configuring the weight) of the capacitor 502b for the positive-side servo control and the capacitor 502d for the negative-side servo control. In addition, the modulation clock and an inversion clock thereof are input to drivers 512a and 512b for the capacitor pair for the signal detection, respectively. An output of the driver 512a for the capacitor pair for the signal detection is connected to electrodes (electrodes not configuring the weight) of the capacitor 501a for the positive-side signal detection and the capacitor 501d for the negative-side signal detection and an output of the driver 512b for the capacitor pair for the signal detection is connected to electrodes (electrodes not configuring the weight) of the capacitor 501b for the positive-side signal detection and the capacitor 501c for the negative-side signal detection.

The output of the differential A/D converter 506 is input to a correlation detection unit 513 and the output of the 1-bit quantizer 509 is also input to the correlation detection unit 513. An output of the correlation detection unit 513 is input to a control unit 514 and differential outputs of the control unit 514 function as control signals and control capacity values of variable capacity units 515a and 515b. The output of the 1-bit quantizer 509 is also input to a driver 516 for a variable capacity and an output of the driver 516 for the variable capacity is connected to one terminal of the variable capacity unit 515a and one terminal of the variable capacity unit 515b. The other terminal of the variable capacity unit 515a is connected to the positive-side weight (movable electrode portion) 500a (that is, the inversion input terminal of the operational amplifier 503a) and the other terminal of the variable capacity unit 515b is connected to the negative-side weight (movable electrode portion) 500b (that is, the inversion input terminal of the operational amplifier 503d). In addition, the output of the 1-bit quantizer 509 is input to a digital low-pass filter 511 and an output of the digital low-pass filter 511 becomes an output of the acceleration sensor. The ASIC includes elements from the differential charge amplifier 503 to the 1-bit D/A converter 510. The variable capacity units 515a and 515b are also mounted in the ASIC.

Next, an operation will be described. If acceleration is applied from the outside to the acceleration sensor, inertial forces of the same direction and the same magnitude are generated in the weights 500a and 500b to be moved. As a result, the weights 500a and 500b are displaced by the same amount in the same direction. Since the weight 500a is also the electrodes of the capacitor pair 501a and 501b for the positive-side signal detection, capacity values of the capacitor pair are changed by the displacement. For example, in FIG. 5, if the acceleration is applied in a rightward direction and the weight 500a is displaced in the rightward direction, a distance between the movable electrode (that is, the weight 500a) of the capacitor 501b for the positive-side signal detection and a fixed electrode thereof decreases and a capacity change value of $+\Delta C_D$ is obtained and a distance between the movable electrode (that is, the weight 500a) of the capacitor 501a for the positive-side signal detection and a fixed electrode thereof increases and a capacity change value of $-\alpha C_D$ is obtained. An application direction and an amount of the acceleration can be detected on the basis of the capacity change values ($+\Delta C_D$ and $-\Delta C_D$) in the capacitor pair 501a and 501b for the positive-side signal detection.

Likewise, because the weight 500b is displaced by the same amount in the rightward direction, a distance between the movable electrode (that is, the weight 500b) of the capacitor 501d for the negative-side signal detection and a fixed electrode thereof decreases and a capacity change value of $+\Delta C_D$ is obtained and a distance between the movable electrode (that is, the weight 500b) of the capacitor 501c for the negative-side signal detection and a fixed electrode thereof increases and a capacity change value of $-\Delta C_D$ is obtained. An application direction and an amount of the acceleration can be detected on the basis of the capacity change values ($+\Delta C_D$ and $-\Delta C_D$) in the capacitor pair 501c and 501d for the negative-side signal detection. A pair structure of the capacitor pair 501a and 501b for the positive-side detection or a pair structure of the capacitor pair 501c and 501d for the negative-side detection is a structure for various known objects not described in detail, for example, for canceling in-phase components of the capacity values. For the convenience of description, parallel plate capacitors are used in the MEMS configuration in the above description and FIG. 5. However, the same mechanism is realized in other types of capacitors. Therefore, the present invention is not limited to the MEMS of the parallel plate capacitor type.

A modulation clock voltage and an inversion clock voltage thereof are applied to the capacitor pair 501a and 501b for the positive-side detection via the drivers 512a and 512b for the capacitor pair for the signal detection, respectively. As a result, the capacity change of $\Delta C_D$ in the capacitor pair 501a and 501b for the positive-side detection is converted into a charge change. Meanwhile, the inversion clock voltage and the modulation clock voltage are applied to the capacitor pair 501c and 501d for the negative-side detection via the drivers 512b and 512a for the capacitor pair for the signal detection, respectively. That is, methods of applying the clock are opposite in the capacitor pair for the positive-side detection and the capacitor pair for the negative-side detection. As a result, the capacity change of $\Delta C_D$ in the capacitor pair 501c and 501d for the negative-side detection is converted into a charge change of a sign (the same magnitude) opposite to a sign of the charge change of the positive side. In other words, $\Delta C_D$ is generated in phase with respect to a "differential MEMS" structure, by the application of the acceleration from the outside. However, because the applied clocks are "differential", the charge changes generated by the positive-side MEMS and the negative-side MEMS become differential signals. The differential charge signal is converted into a differential voltage signal by the differential charge amplifier 503 of an initial step in the ASIC. The differential charge amplifier 503 has a configuration in which so-called operational amplifier inversion amplifiers of a capacitive type are disposed in bi-parallel. At the positive side, input capacitors are the capacitor pair 501a and 501b for the positive-side signal detection at the MEMS side and a feedback capacitor is the feedback capacitor 503b at the ASIC side. However, the feedback resistor 503c having a high resistance value is inserted into a feedback path in parallel. This is to secure a direct-current feed path to compensate for an input leak current of the operational amplifier 503a. Meanwhile, measures using a reset switch in a portion of the feedback resistor 503c are known conventionally. However, in this case, there is a problem in that a noise density of a sampling noise by the reset switch is high. Since a thermal noise by the feedback resistor 503c having the high resistance value used in this method is sufficiently suppressed in the vicinity of a desired frequency (that is, a frequency of the modulation clock) by a low-pass filter characteristic by the feedback resistor 503c and the feedback capacitor 503b, there is no problem. Likewise, at the negative side, input capacitors are the capacitor pair 501c and 501d for the negative-side signal detection at the MEMS side and a feedback capacitor is the feedback capacitor 503e at the ASIC side. However, the feedback resistor 503f having a high resistance value is inserted into a feedback path in parallel. The reason is as described above.

A signal converted into a differential voltage by the differential charge amplifier 503 is amplified by the differential amplifier 504, a noise or an unnecessary signal component thereof is suppressed by the differential analog filter 505, and the signal is converted into a digital value by the differential A/D converter 506. The demodulator 507 is a digital multiplier of two inputs and multiplies the output of the A/D converter 506 and the modulation clock and performs synchronous detection for the modulation clock. As a result, values proportional to the displacements of the weights 500a and 500b are obtained in an output of the demodulator 507. A series of modulation/demodulation processing is equivalent to a so-called "chopper system". As a result, an influence by a loud 1/f noise generated by the differential charge amplifier 503, the differential amplifier 504, the differential analog filter 505, and the differential A/D converter 506 can be avoided.

The servo control unit 508 is a circuit that receives the displacement values of the weights 500a and 500b demodulated by the demodulator 507, determines servo values to generate forces in directions reverse to detection signals, on the basis of the values, and outputs the servo values to the 1-bit quantizer 509. Particularly, a digital integration operation may be included in signal processing in the servo control unit 508 and control may be performed such that the displacements of the weights 500a and 500b become zero. As a result, because the capacity value changes of the capacitor pair 501a and 501b for the positive-side signal detection and the capacitor pair 501c and 501d for the negative-side signal detection are minimized, linearity of the acceleration sensor can be increased. In addition, a differentiation (or difference) operation may be included in the signal processing in the servo control unit 508, phase compensation may be performed, and a servo control loop may be stabilized. At this time, logic of general PID control can be applied.

The 1-bit quantizer 509 quantizes the servo value determined and output by the servo control unit 508 with 1 bit. For example, if an input of the 1-bit quantizer 509 is 0 or more, the 1-bit quantizer 509 outputs +1 and if the input is negative, the 1-bit quantizer 509 outputs −1. The 1-bit D/A converter 510 receives a digital value (±1) of 1 bit quantized by the 1-bit quantizer 509 and converts the digital value into an analog voltage (for example, ±5 V or 10 V/0 V). A positive-side output voltage of the 1-bit D/A converter 510 is applied to the fixed electrodes of the capacitor pair 502a for the positive-side servo control and the capacitor pair 502c for the negative-side servo control and a negative-side output voltage of the 1-bit D/A converter 510 is applied to the fixed electrodes of the capacitor pair 502b for the positive-side servo control and the capacitor pair 502d for the negative-side servo control. As a result, electrostatic forces in directions reverse to the detected acceleration signals can be applied to the weights 500a and 500b. Differently from the case of the capacitors for the signal detection, an output of the 1-bit D/A converter 510 is applied to the capacitors for the servo control "in phase" with respect to a "differential MEMS" structure. As a result, the acceleration signals generated in phase with respect to the "differential MEMS" structure are canceled in phase. In a steady state, net force acting on the weights 500a and 500b and the displacements of the weights 500a and 500b become almost zero. As such, the 1-bit quantizer 509 is inserted, so that a subsequent D/A converter can be configured as the 1-bit D/A converter 510. Since the 1-bit D/A converter is easily mounted in terms of a circuit, the 1-bit D/A converter is advantageous to low consumption power. In addition, a capacity unit for servo control can be simplified. In an output of the 1-bit quantizer 509, because a high frequency component (that is, a quantization error noise-shaped (diffused) to a high frequency side by sigma-delta control of a servo loop) is suppressed by the digital low-pass filter 511, a final output of the acceleration sensor can be made to have a low noise. By the above configuration, in this acceleration sensor, the signal detection and the servo control are performed at the same time in the differential MEMS structure.

In the present invention, an output signal of the A/D converter 506 and an output signal of the 1-bit quantizer 509 are correlated by the correlation detection unit 513. This is to detect a mismatch ΔC (ΔC=capacity value of capacitor 502a for positive-side servo control+capacity value of capacitor 502d for negative-side servo control−capacity value of capacitor 502b for positive-side servo control−capacity value of capacitor 502c for negative-side servo control) of capacity values in the capacitor pair 502a and 502b for the positive-side servo control and the capacitor pair 502c and 502d for the negative-side servo control. If ΔC exists, a servo leak signal proportional to ΔC is generated in the output of the differential charge amplifier 503, the servo leak signal is amplified hereinafter by the differential amplifier 504, a high frequency component of the servo leak signal is suppressed to a certain degree by the differential analog filter 505, and the servo leak signal is converted into a digital value by the differential A/D converter 506. The same waveform as a waveform of an output signal of the 1-bit quantizer 509 and an inversion waveform thereof are differentially applied to the capacitor pair 502a and 502b for the positive-side servo control and the capacitor pair 502c and 502d for the negative-side servo control via the 1-bit D/A converter 510. For this reason, the servo leak signal has almost the same waveform as the waveform of the output signal of the 1-bit quantizer 509. That is, the servo leak signal is proportional to ΔC and has the same waveform as the waveform of the output signal of the 1-bit quantizer 509. Focusing on the above fact, the servo leak signal included in the output of the differential A/D converter 506 can be detected. To do this, the output signal of the differential A/D converter 506 and the output signal of the 1-bit quantizer 509 are correlated in the correlation detection unit 513, as described above. As a result, a direct-current or low frequency signal proportional to ΔC can be included in the output of the correlation detection unit 513.

Therefore, the subsequent control unit 514 executes a digital integration operation or a phase compensation operation according to necessity, with respect to the output signal of the correlation detection unit 513, and determines and outputs differential capacity control values. The differential capacity control values are digital values. Thereby, capacity values of the variable capacity units 515a and 515b are controlled. The differential capacity control values may be complementary to each other (that is, signs are opposite and magnitudes are the same). An object of the variable capacity units 515a and 515b is to cancel an influence by ΔC on differential input nodes (that is, an inversion input terminal node of the operational amplifier 503a and an inversion input terminal node of the operational amplifier 503d) of the differential charge amplifier 503. To do this, it is considered that a capacitor of the same capacity value as the mismatch ΔC in the capacitor pair 502a and 502b for the positive-side servo control and the capacitor pair 502c and 502d for the negative-side servo control is inserted between the node and one output of the 1-bit D/A converter 510. However, this method has two problems.

First, the output of the 1-bit D/A converter 510 has high voltage amplitude of about 10 V. For this reason, when a voltage amplitude level is input to the variable capacity unit 515a or 515b mounted in the ASIC as it is, a waveform may be clipped by an electrostatic discharge damage protection element (ESD element) connected to the input terminal of the ASIC to do so. Finally, a desired voltage is not transmitted to the variable capacity unit 515a or 515b. In this acceleration sensor, because a semiconductor process of a low voltage is applied to the ASIC for low consumption power, an input voltage range in which clipping is not generated is smaller than output amplitude of the 1-bit D/A converter 510. For this reason, the waveform clipping is generated.

Second, in the case of the above method, it may be necessary to adjust the capacity values to the same capacity values with extremely high precision. For example, in the case in which ΔC is the mismatch of about 1% and it is necessary to cancel ΔC with precision of 0.01%, if it is assumed that the capacity values in the capacitor pair 502a and 502b for the positive-side servo control and the capacitor pair 502c and 502d for the negative-side servo control are 5 pF, a variable capacity unit capable of being controlled with 5 pF×0.01/10=0.5 fF increments is necessary. Capacity value increment precision is unrealistic in view of processing dimension precision of a semiconductor process or a parasitic capacity value.

Therefore, in the present invention, lower ends of the variable capacity units 515a and 515b are connected to the output of the driver 516 for the variable capacity, not the output of the 1-bit D/A converter 510. The output of the 1-bit D/A converter 510 has high voltage amplitude (for example, ±5 V or 10 V/0 V) to generate sufficient electrostatic force. However, the driver 516 for the capacity is inserted, so that output amplitude of the output signal of the driver 516 for the capacity can be decreased while the output signal is made to have the same waveform (that is, the same waveform as the waveform of the output signal of the 1-bit quantizer 509) as the waveform of the output signal of the 1-bit D/A converter 510. For example, if the output voltage amplitude of the 1-bit D/A converter 510 is set to ±V and the output amplitude of the driver 516 for the capacity is set to V/α (α>1), a capacity value necessary for canceling error charges generated by ΔC is αΔC and can be multiplied by α. That is, the capacity value increment precision can also be multiplied by α. For example, α=20 is set, so that the capacity value increment precision needed in the previous example increases from 0.5 fF to 10 fF. It is considered that the variable capacity units 515a and 515b of the capacity value increment precision of the above degree can be sufficiently realized by a realistic semiconductor process.

Even when the servo leak signal is weak, the servo leak signal disturbs the servo loop remarkably and causes a noise increase or an unjust oscillation. For this reason, it is absolutely necessary to cancel the influence of the mismatch ΔC in the capacitor pair 502a and 502b for the positive-side servo control and the capacitor pair 502c and 502d for the negative-side servo control with high precision, as described above. An integration operation is included in the control unit 514, so that negative feedback control can be executed such that ΔC and the servo leak signal become zero. A negative feedback control loop is hereinafter called an "MEMS capacity compensation loop".

The "differential MEMS" structure disclosed in this embodiment has three great advantages. First, because a signal amount doubles with respect to the same acceleration signal, a double circuit noise can be allowed. That is, consumption power of a circuit can be reduced to ¼ theoretically. Second, because the acceleration sensor is not affected by an in-phase noise (power noise of the differential charge amplifier) of the circuit, a noise can be reduced. Third, even when the capacity values for the servo control are changed by the displacements of the weights, in ΔC (ΔC=capacity value of capacitor 502a for positive-side servo control+capacity value of capacitor 502d for negative-side servo control−capacity value of capacitor 502b for positive-side servo control−capacity value of capacitor 502c for negative-side servo control), the changes are canceled and the acceleration sensor is not affected by the changes. That is, in the case of the differential MEMS structure, because ΔC is regarded as a static value determined by an initial MEMS manufacturing variation, a band of an MEMS capacity compensation loop can be narrowed and a design of the control unit 514 is facilitated. As a result, a noise can be further reduced.

Effect of Fifth Embodiment

As described above, according to the acceleration sensor in the fifth embodiment, the signal detection and the servo control are performed at the same time and the servo leak signal according to the mismatch of the capacity values of the MEMS capacitive elements can be canceled with high precision. Therefore, the noise increase or the unjust oscillation according to the servo leak signal can be prevented. For this reason, even when an MEMS process in which a manufacturing variation is large is used, a capacitive MEMS acceleration sensor of a low noise and low consumption power can be realized. As compared with the first embodiment, because the MEMS has the differential structure, a mounting area increases. However, a noise can be further reduced.

Sixth Embodiment

Figure 6:
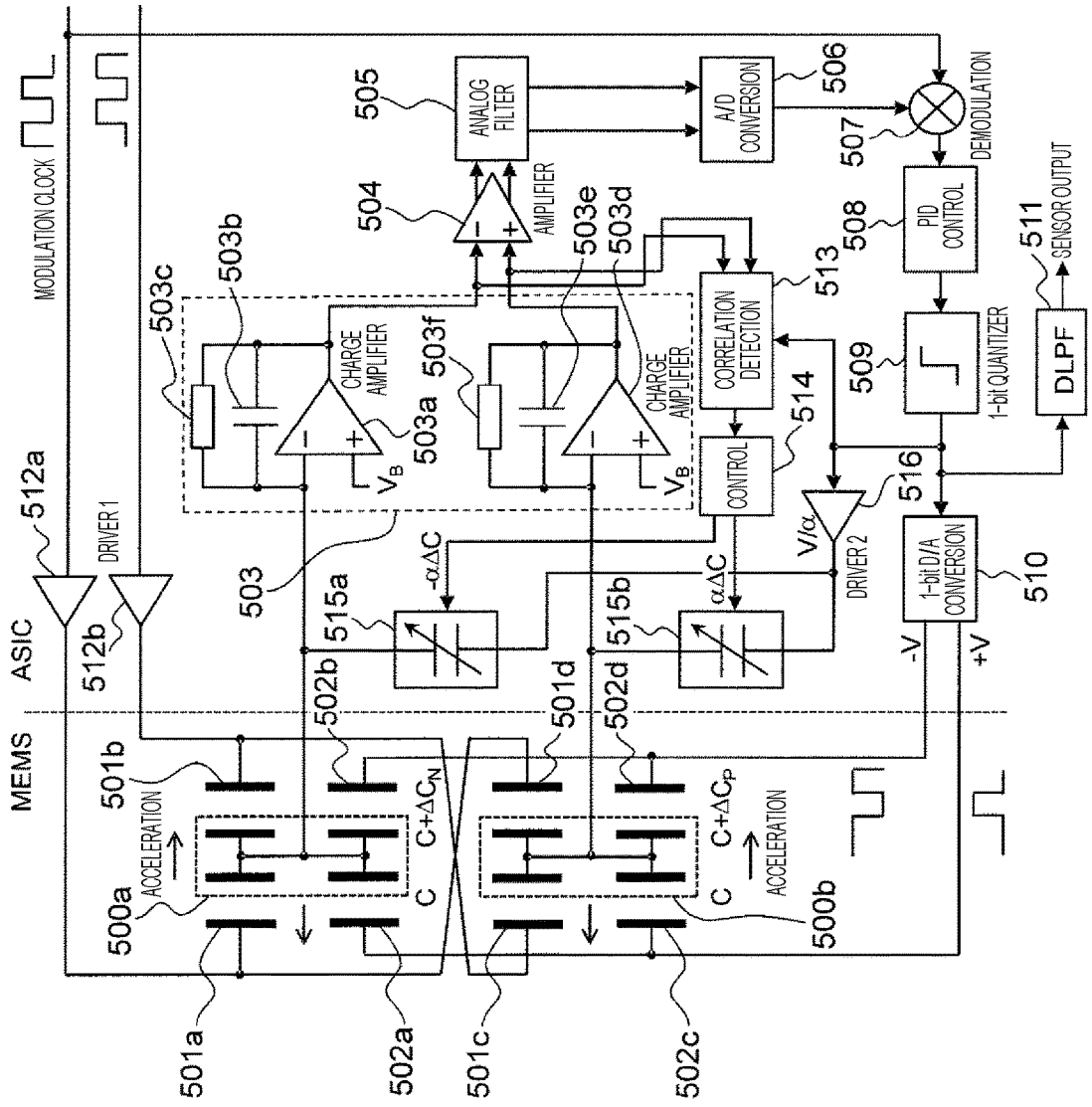
FIG. 6 is a diagram illustrating an example of a configuration of an acceleration sensor according to a sixth embodiment of the present invention.

FIG. 6 illustrates a sixth embodiment of the present invention. Since a basic portion of this embodiment is the same as that of the fifth embodiment, a difference with the fifth embodiment will be described. In this embodiment, a correlation detection unit 513 is connected to an output of a differential charge amplifier 503, not an output of a differential A/D converter 506, as in the fifth embodiment. For this reason, the correlation detection unit 513 correlates a servo leak signal included in the output of the differential charge amplifier 503 with an output signal of a 1-bit quantizer 509 and detects the servo leak signal. Differently from the fifth embodiment of the present invention, the servo leak signal of the output of the differential charge amplifier 503 is detected directly not via a differential amplifier 504, a differential analog filter 505, and the differential A/D converter 506. Therefore, because there is no delay of the servo leak signal by each analog circuit block, an MEMS capacity compensation loop is easily stabilized and a parameter design of a control unit 514 is facilitated. Instead, a point that it is necessary to realize the correlation detection unit 513 with an analog circuit and a point that an A/D converter is necessary separately in the control unit 514 become demerits as compared with the fifth embodiment.

Effect of Sixth Embodiment

As described above, according to an acceleration sensor in the sixth embodiment, signal detection and servo control are performed at the same time and the servo leak signal according to a mismatch of capacity values of MEMS capacitive elements can be canceled with high precision. Therefore, a noise increase or an unjust oscillation according to the servo leak signal can be prevented. For this reason, even when an MEMS process in which a manufacturing variation is large is used, a capacitive MEMS acceleration sensor of a low noise and low consumption power can be realized. Since the servo leak signal of the output of the differential charge amplifier is directly detected, a stabilization design is easy.

Seventh Embodiment

Figure 7:
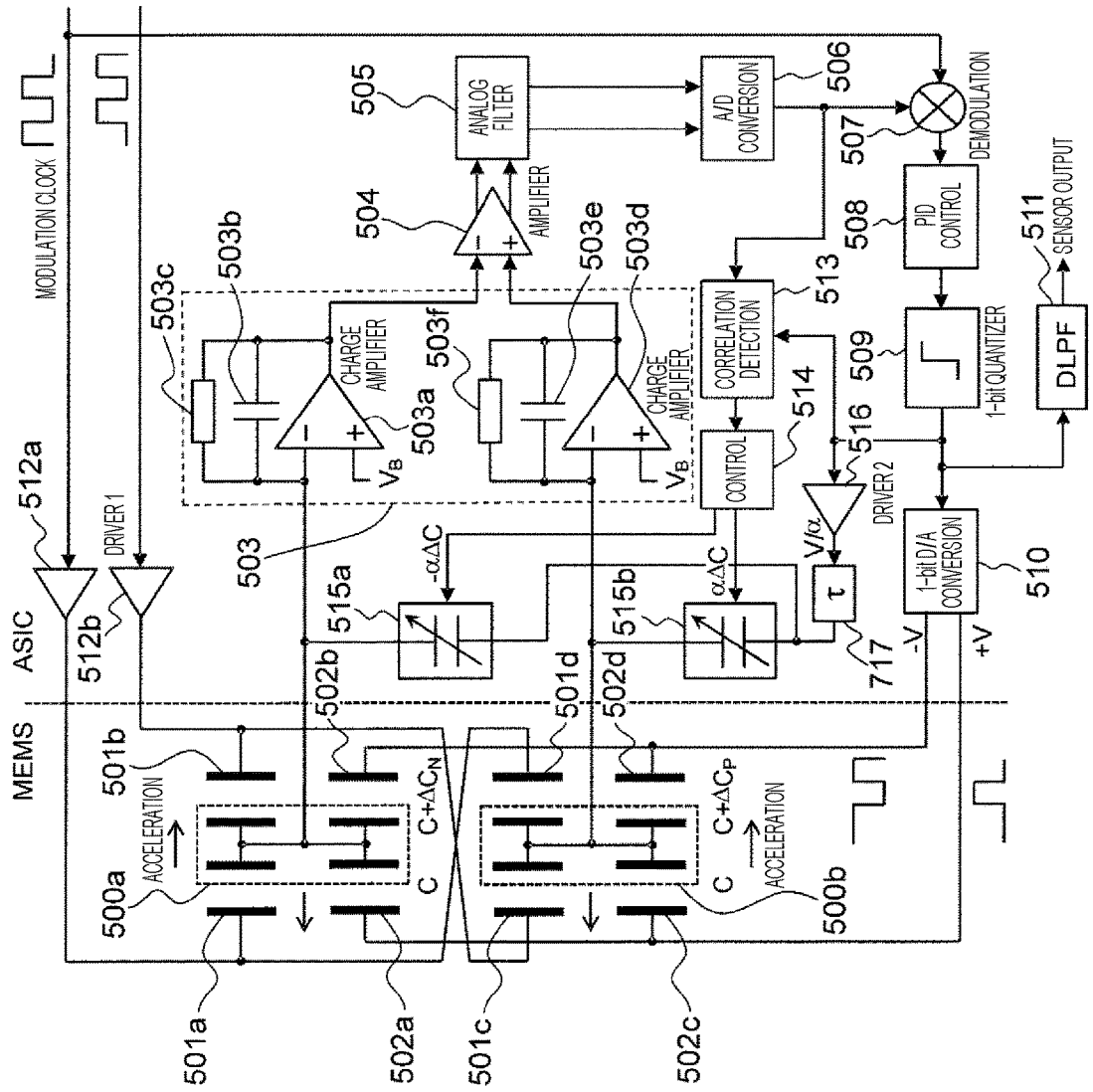
FIG. 7 is a diagram illustrating an example of a configuration of an acceleration sensor according to a seventh embodiment of the present invention.

FIG. 7 illustrates a seventh embodiment of the present invention. Since a basic portion of this embodiment is the same as that of the fifth embodiment, a difference with the fifth embodiment will be described. In this embodiment, a delay unit 717 is inserted between a driver 516 for a variable capacity and variable capacity units 515a and 515b. An object of the delay unit 717 is to simulate a response delay due to a limitation of the driving capability of a 1-bit D/A converter 510. The response delay of the 1-bit D/A converter 510 is determined by a time constant to be a product of output resistance thereof and capacity values of capacitors 502a and 502b for positive-side servo control and capacitors 502c and 502d for negative-side servo control and becomes a primary low-pass filter characteristic. Therefore, the delay unit 717 is configured as a primary low-pass filter having almost the same time constant, so that an output waveform of the 1-bit D/A converter 510 can be simulated. As a result, cancellation of the servo leak signal disclosed in the fifth embodiment can be performed completely.

Effect of Seventh Embodiment

As described above, according to an acceleration sensor in the seventh embodiment, signal detection and servo control are performed at the same time and the servo leak signal according to a mismatch of capacity values of MEMS capacitive elements can be canceled with high precision. Therefore, a noise increase or an unjust oscillation according to the servo leak signal can be prevented. For this reason, even when an MEMS process in which a manufacturing variation is large is used, a capacitive MEMS acceleration sensor of a low noise and low consumption power can be realized. Since delay compensation of the 1-bit D/A converter is performed by the delay unit, the servo leak signal can be canceled with higher precision.

Eighth Embodiment

Figure 8:
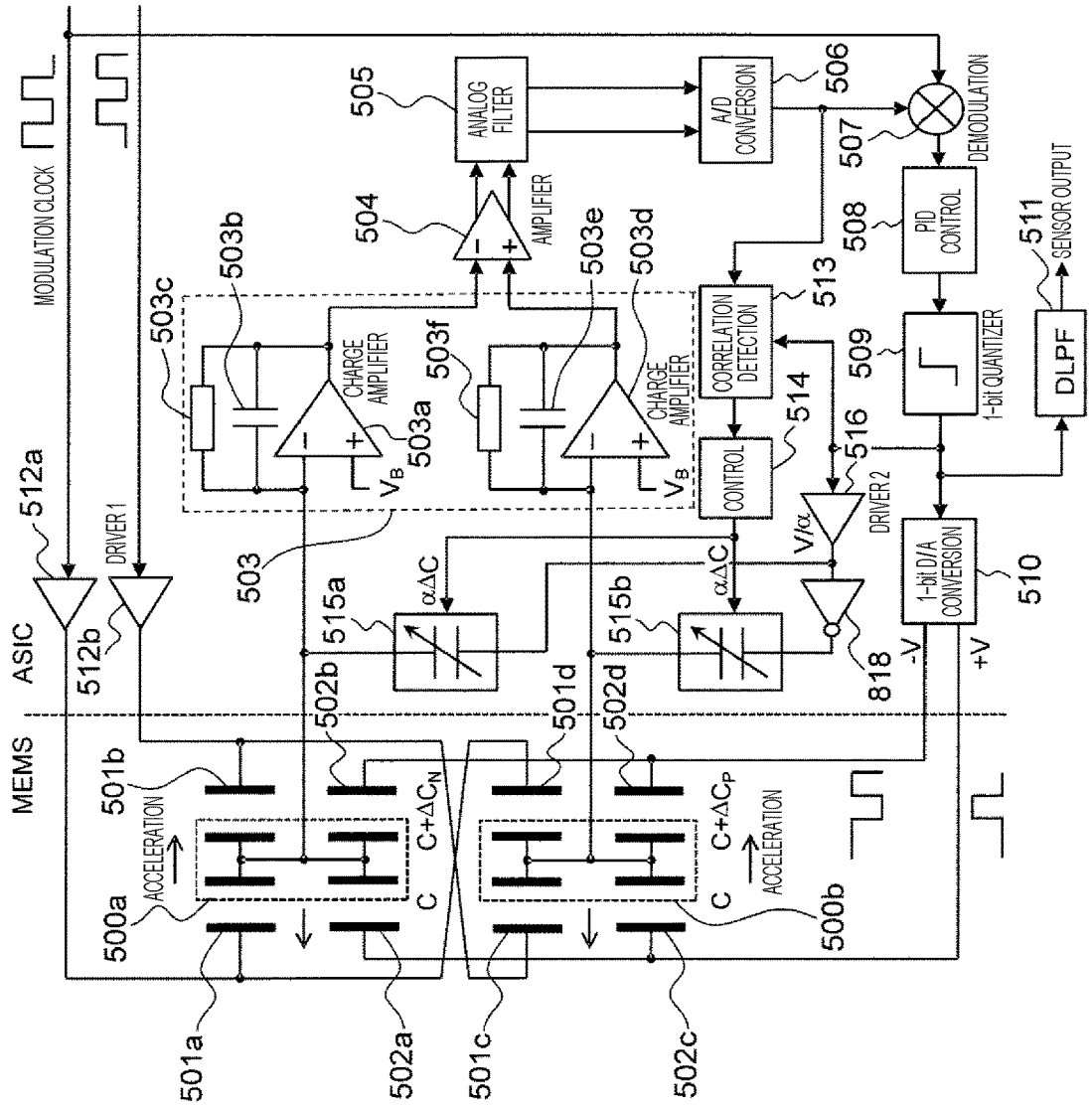
FIG. 8 is a diagram illustrating an example of a configuration of an acceleration sensor according to an eighth embodiment of the present invention.

FIG. 8 illustrates an eighth embodiment of the present invention. Since a basic portion of this embodiment is the same as that of the fifth embodiment, a difference with the fifth embodiment will be described. In this embodiment, an inverter 818 is inserted between a driver 516 for a variable capacity and a variable capacity unit 515b. As a result, because a voltage applied to a lower end of a variable capacity unit 515a and a voltage applied to a lower end of the variable capacity unit 515b are logically inverted, a control signal from a control unit 514 can be used commonly for the variable capacity unit 515a and the variable capacity unit 515b.

Effect of Eighth Embodiment

As described above, according to an acceleration sensor in the eighth embodiment, signal detection and servo control are performed at the same time and a servo leak signal according to a mismatch of capacity values of MEMS capacitive elements can be canceled with high precision. Therefore, a noise increase or an unjust oscillation according to the servo leak signal can be prevented. For this reason, even when an MEMS process in which a manufacturing variation is large is used, a capacitive MEMS acceleration sensor of a low noise and low consumption power can be realized.

Ninth Embodiment

Figure 9:
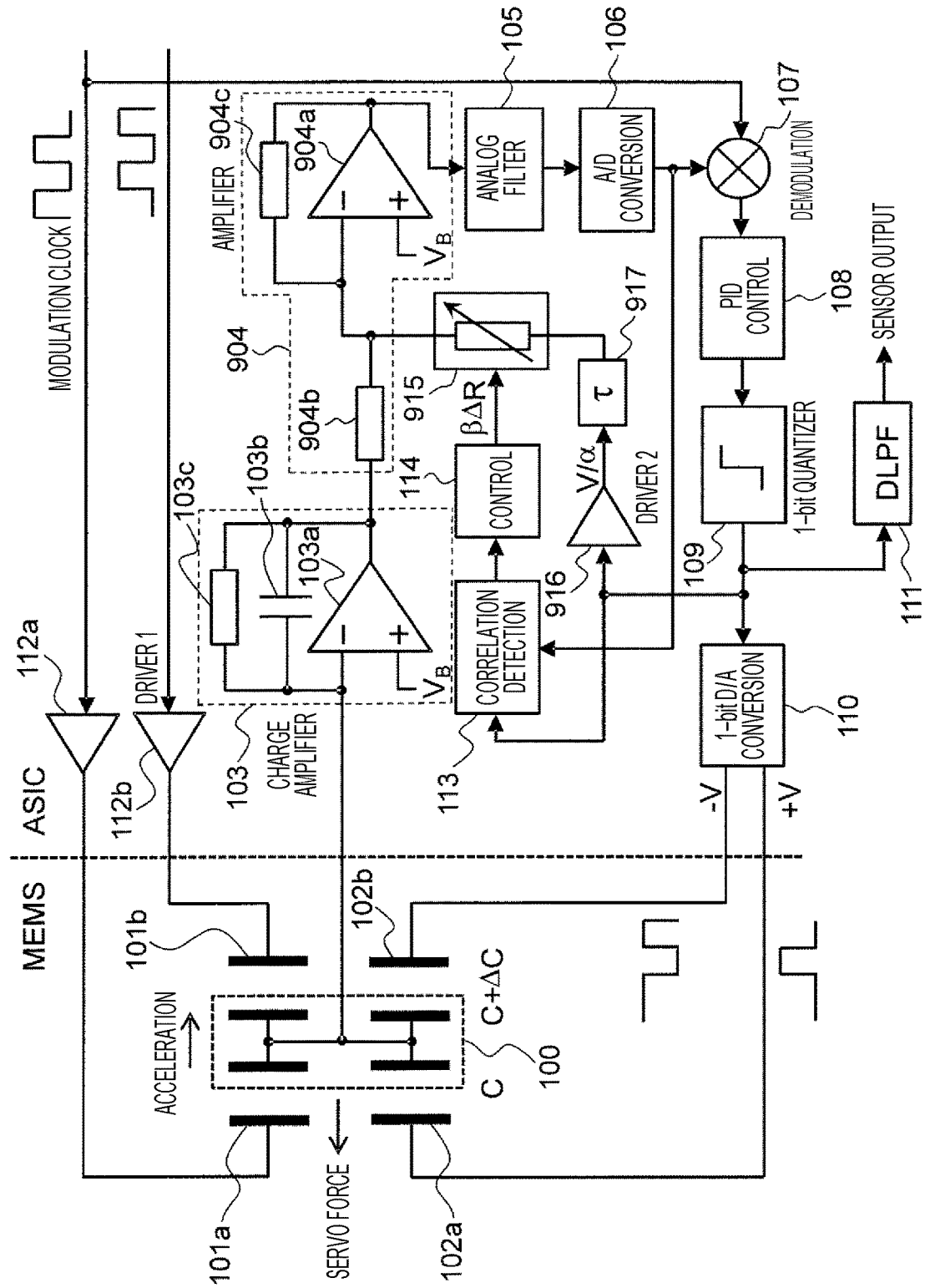
FIG. 9 is a diagram illustrating an example of a configuration of an acceleration sensor according to a ninth embodiment of the present invention.

An acceleration sensor according to a ninth embodiment will be described using FIG. 9. FIG. 9 is a diagram illustrating an example of a configuration of the acceleration sensor. Differently from the first embodiment, a variable resistance unit is used and an MEMS capacity is compensated for in an amplifier of a next step, not a charge amplifier of an initial step.

In the acceleration sensor, a mechanical portion is configured using micro electro mechanical systems (MEMS) and a circuit portion is configured using an application specific integrated circuit (ASIC). The acceleration sensor is not limited thereto. For example, the acceleration sensor is used for an MEMS capacitive acceleration sensor detecting vibration acceleration extremely smaller than gravity, as a sensor for a seismic reflection survey to explore for oil or natural gas.

First, a configuration will be described. The MEMS includes a capacitor pair 101a and 101b for signal detection and a capacitor pair 102a and 102b for servo control. One electrode of each of the four capacitors is connected mechanically and electrically and forms one weight (movable electrode portion) 100. The weight is connected to an inversion input terminal of an operational amplifier 103a configuring a charge amplifier 103. The charge amplifier 103 is configured using the operational amplifier 103a, a feedback capacitor 103b, and a feedback resistor 103c. A bias voltage $V_B$ is connected to a non-inversion input terminal of the operational amplifier 103a. $V_B$ may be a ground potential or may not be the ground potential. An output (that is, an output of the operational amplifier 103a) of the charge amplifier 103 is input to an amplifier 904. The amplifier 904 is an operational amplifier inversion amplification circuit of a resistance feedback type and includes an operational amplifier 904a, an input resistor 904b, and a feedback resistor 904c. The bias voltage $V_B$ is connected to a non-inversion input terminal of the operational amplifier 904a. $V_B$ may be a ground potential or may not be the ground potential. An output (that is, an output of the operational amplifier 904a) of the amplifier 904 is input to an analog filter 105 and an output of the analog filter 105 is input to an A/D converter 106. An output of the A/D converter 106 is input to a demodulator 107. A modulation clock is also input to the demodulator 107. An output of the demodulator 107 is input to a servo control unit 108, an output of the servo control unit 108 is input to a 1-bit quantizer 109, and an output of the 1-bit quantizer 109 is input to a 1-bit D/A converter 110. Differential outputs of the 1-bit D/A converter 110 are connected to electrodes (electrodes not configuring the weight) of the capacitor pair 102a and 102b for the servo control, respectively. In addition, the modulation clock and an inversion clock thereof are input to drivers 112a and 112b for the capacitor pair for the signal detection, respectively, and outputs of the drivers are connected to electrodes (electrodes not configuring the weight) of the capacitor pair 101a and 101b for the signal detection, respectively. The output of the A/D converter 106 is also input to a correlation detection unit 113 and the output of the 1-bit quantizer 109 is also input to the correlation detection unit 113. An output of the correlation detection unit 113 is input to a control unit 114 and an output of the control unit 114 functions as a control signal and controls a resistance value of a variable resistance unit 915. The output of the 1-bit quantizer 109 is also input to a driver 916, an output of the driver 916 is input to a delay unit 917, and an output of the delay unit 917 is connected to one terminal of the variable resistance unit 915. The other terminal of the variable resistance unit 915 is connected to an inversion input terminal node of the operational amplifier 904a. In addition, the output of the 1-bit quantizer 109 is input to a digital low-pass filter 111 and an output of the digital low-pass filter 111 becomes an output of the acceleration sensor. The ASIC includes elements from the charge amplifier 103 to the 1-bit D/A converter 110.

Next, an operation will be described. If acceleration is applied from the outside to the acceleration sensor, inertial force is generated in the weight 100 to be moved. As a result, the weight 100 is displaced. Since the weight 100 is also the electrodes of the capacitor pair 101a and 101b for the signal detection, capacity values of the capacitor pair are changed by the displacement. For example, in FIG. 9, if the acceleration is applied in a rightward direction and the weight 100 is displaced in the rightward direction, a distance between the movable electrode (that is, the weight 100) of the capacitor 101b for the signal detection and a fixed electrode thereof decreases and a capacity change value of $+\Delta C_D$ is obtained and a distance between the movable electrode (that is, the weight 100) of the capacitor 101a for the signal detection and a fixed electrode thereof increases and a capacity change value of $-\Delta C_D$) is obtained. An application direction and an amount of the acceleration can be detected on the basis of the capacity change values ($+\Delta C_D$ and $-\Delta C_D$) in the capacitor pair 101a and 101b for the signal detection. A pair structure of the capacitor pair 101a and 101b for the detection is a structure for various known objects not described in detail, for example, for canceling in-phase components of the capacity values. For the convenience of description, parallel plate capacitors are used in the MEMS configuration in the above description and FIG. 9. However, the same mechanism is realized in other types of capacitors. Therefore, the present invention is not limited to the MEMS of the parallel plate capacitor type.

A modulation clock voltage and an inversion clock voltage thereof are applied to the capacitor pair 101a and 101b for the detection via the drivers 112a and 112b for the capacitor pair for the signal detection, respectively. As a result, the capacity change of $\Delta C_D$ is converted into a charge change. The charge change is converted into the voltage change by the charge amplifier 103 of an initial step in the ASIC. The charge amplifier 103 has a configuration of a so-called operational amplifier inversion amplifier of a capacitive type and input capacitors are the capacitor pair 101a and 101b for the signal detection at the MEMS side and a feedback capacitor is the feedback capacitor 103b at the ASIC side. However, the feedback resistor 103c having a high resistance value is inserted into a feedback path in parallel. This is to secure a direct-current feed path to compensate for an input leak current of the operational amplifier 103a. Meanwhile, measures using a reset switch in a portion of the feedback resistor 103c are known conventionally. However, in this case, there is a problem in that a noise density of a sampling noise by the reset switch is high. Since a thermal noise by the feedback resistor 103c having the high resistance value used in this method is sufficiently suppressed in the vicinity of a desired frequency (that is, a frequency of the modulation clock) by a low-pass filter characteristic by the feedback resistor 103c and the feedback capacitor 103b, there is no problem.

A signal converted into a voltage by the charge amplifier 103 is amplified by the amplifier 904, a noise or an unnecessary signal component thereof is suppressed by the analog filter 105, and the signal is converted into a digital value by the A/D converter 106. The demodulator 107 is a digital multiplier of two inputs and multiplies the output of the A/D converter 106 and the modulation clock and performs synchronous detection for the modulation clock. As a result, a value proportional to the displacement of the weight 100 is obtained in an output of the demodulator 107. A series of modulation/demodulation processing is equivalent to a so-called "chopper system". As a result, an influence by a loud 1/f noise generated by the charge amplifier 103, the amplifier 904, the analog filter 105, and the A/D converter 106 can be avoided. The servo control unit 108 is a circuit that receives the displacement value of the weight 100 demodulated by the demodulator 107, determines a servo value to generate force in a direction reverse to a detection signal, on the basis of the value, and outputs the servo value to the 1-bit quantizer 109. Particularly, a digital integration operation may be included in signal processing in the servo control unit 108 and control may be performed such that the displacement of the weight 100 becomes zero. As a result, because the capacity value changes of the capacitor pair 101a and 101b for the signal detection are minimized, linearity of the acceleration sensor can be increased. In addition, a differentiation (or difference) operation may be included in the signal processing in the servo control unit 108, phase compensation may be performed, and a servo control loop may be stabilized. At this time, logic of general PID control can be applied.

The 1-bit quantizer 109 quantizes the servo value determined and output by the servo control unit 108 with 1 bit. For example, if an input of the 1-bit quantizer 109 is 0 or more, the 1-bit quantizer 109 outputs +1 and if the input is negative, the 1-bit quantizer 109 outputs −1. The 1-bit D/A converter 110 receives a digital value (±1) of 1 bit quantized by the 1-bit quantizer 109, converts the digital value into an analog voltage (for example, ±5 V or 10 V/0 V), and applies the analog voltage to the fixed electrodes of the capacitor pair 102a and 102b for the servo control. As a result, electrostatic force in a direction reverse to the detected acceleration signal can be applied to the weight 100. In a steady state, net force acting on the weight 100 and the displacement of the weight 100 become almost zero. As such, the 1-bit quantizer 109 is inserted, so that a subsequent D/A converter can be configured as the 1-bit D/A converter 110. Since the 1-bit D/A converter is easily mounted in terms of a circuit, the 1-bit D/A converter is advantageous to low consumption power. In addition, a capacity unit for servo control can be simplified. In an output of the 1-bit quantizer 109, because a high frequency component (that is, a quantization error noise-shaped (diffused) to a high frequency side by sigma-delta control of a servo loop) is suppressed by the digital low-pass filter 111, a final output of the acceleration sensor can be made to have a low noise. By the above configuration, in this acceleration sensor, the signal detection and the servo control are performed at the same time.

In the present invention, an output signal of the A/D converter 106 and an output signal of the 1-bit quantizer 109 are correlated by the correlation detection unit 113. This is to detect a mismatch $\Delta C$ of capacity values in the capacitor pair 102a and 102b for the servo control. If $\Delta C$ exists, a servo leak signal proportional to $\Delta C$ is generated in the output of the charge amplifier 103, the servo leak signal is amplified hereinafter by the amplifier 904, a high frequency component of the servo leak signal is suppressed to a certain degree by the analog filter 105, and the servo leak signal is converted into a digital value by the A/D converter 106. The same waveform as a waveform of an output signal of the 1-bit quantizer 109 and an inversion waveform thereof are differentially applied to the capacitor pair 102a and 102b for the servo control via the 1-bit D/A converter 110. For this reason, the servo leak signal has almost the same waveform as the waveform of the output signal of the 1-bit quantizer 109. That is, the servo leak signal is proportional to $\Delta C$ and has the same waveform as the waveform of the output signal of the 1-bit quantizer 109. Focusing on the above fact, the servo leak signal included in the output of the A/D converter 106 can be detected. To do this, the output signal of the A/D converter 106 and the output signal of the 1-bit quantizer 109 are correlated in the correlation detection unit 113, as described above. As a result, a direct-current or low frequency signal proportional to ΔC can be included in the output of the correlation detection unit 113.

Therefore, the subsequent control unit 114 executes a digital integration operation or a phase compensation operation according to necessity, with respect to the output signal of the correlation detection unit 113, and determines and outputs a resistance control value. The resistance control value is a digital value. Thereby, a resistance value of the variable resistance unit 915 is controlled. An object of the variable resistance unit 915 is to cancel an influence by ΔC on an inversion input terminal node of the operational amplifier 904a of the amplifier 904, using a method of a so-called "operational amplifier subtracter". However, differently from the other embodiments of the present invention, because the influence of ΔC is canceled via the charge amplifier 103, it is necessary to apply a voltage waveform having compensated for a primary high-pass filter characteristic by the feedback capacitor 103b and the feedback resistor 103c of the charge amplifier 103 and a low-pass filter characteristic by a finite band of the operational amplifier 103a to a lower end of the variable resistance unit 915. For this reason, it is necessary to insert the delay unit 917. Similarly to the other embodiments, an integration operation is included in the control unit 114, so that negative feedback control can be executed such that ΔC and the servo leak signal become zero.

Effect of Ninth Embodiment

As described above, according to the acceleration sensor in the ninth embodiment, the signal detection and the servo control are performed at the same time and the servo leak signal according to the mismatch of the capacity values of the MEMS capacitive elements can be canceled with high precision. Therefore, a noise increase or an unjust oscillation according to the servo leak signal can be prevented. For this reason, even when an MEMS process in which a manufacturing variation is large is used, a capacitive MEMS acceleration sensor of a low noise and low consumption power can be realized.

In the acceleration sensors according to the first to ninth embodiments described above, the acceleration sensors may be configured by using a 1.5-bit (three values) quantizer or a multi-bit quantizer in place of the 1-bit quantizers 109 and 509 and correspondingly using a 1.5-bit (three values) D/A converter or a multi-bit D/A converter in place of the 1-bit D/A converters 110 and 510.

For the acceleration sensor according to each embodiment, first, it is considered that each of the MEMS of the mechanical portion and the ASIC of the circuit portion is formed on an individual semiconductor substrate and is configured as an individual semiconductor chip. However, in the future, it is considered that the MEMS and the ASIC are formed on the same semiconductor chip.

The acceleration sensor according to each embodiment configures a one-dimensional acceleration sensor. For example, when the acceleration sensor is used for a sensor for a seismic reflection survey to explore for oil or natural gas, a configuration of the one-dimensional acceleration sensor is used. For example, when the acceleration sensor is used for a three-dimensional acceleration sensor, a configuration in which three modules of one-dimensional acceleration sensors are formed for individual dimensions or three MEMSs are connected to a common ASIC is considered.

Also, it is considered that the MEMS capacitive acceleration sensor illustrated in each embodiment is used for a vehicle in the future.

<<Configurations of Correlation Detection Unit, Control Unit, Variable Capacity Unit, and Variable Resistance Unit>>

Figure 10:
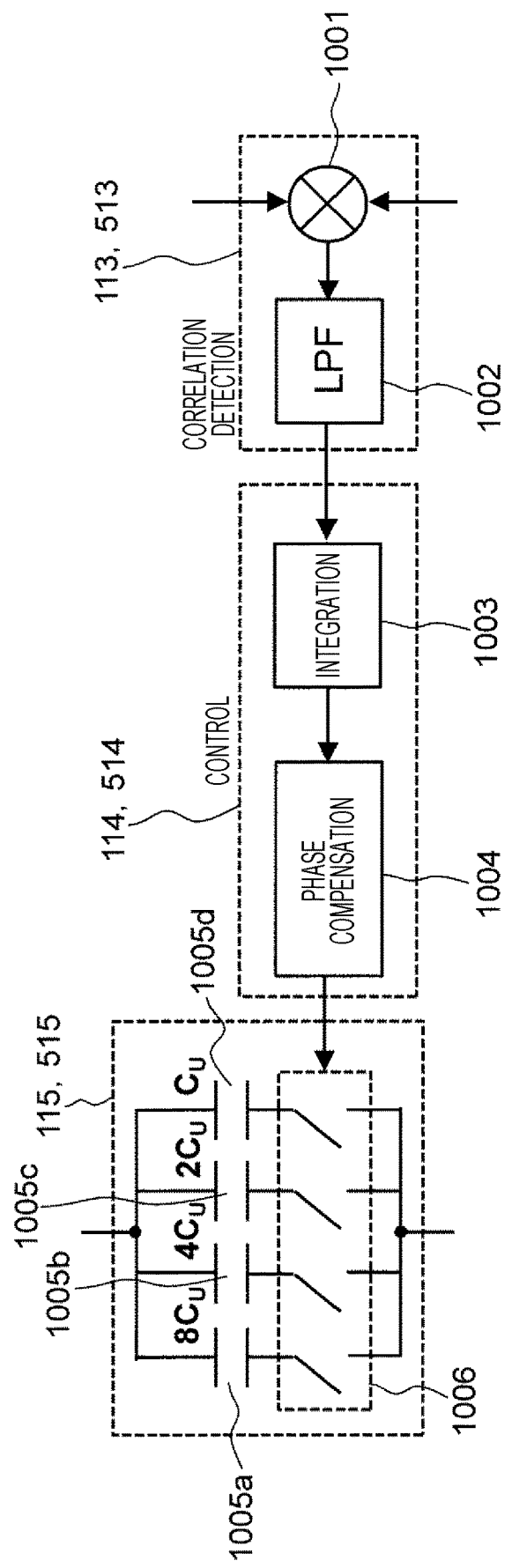
FIG. 10 is a first diagram specifically illustrating configurations of a correlation detection unit, a control unit, and a variable capacity unit of an acceleration sensor according to the present invention.

FIG. 10 illustrates one example of the correlation detection unit 113 (513), the control unit 114 (514), and the variable capacity unit 115 (515a and 515b) applied in the first embodiment (fifth embodiment). The correlation detection unit 113 can be realized by a digital multiplier 1001 and a digital low-pass filter 1002 connected to an output thereof. In addition, the control unit 114 can be realized by a digital integrator 1003 and a phase compensation unit 1004 connected to an output thereof. The phase compensation unit 1004 includes a differentiation (or difference) operation, generates a zero point to advance a phase by the differentiation (or difference) operation, and stabilizes servo control. The variable capacity unit 115 is controlled by a digital value of an output of the phase compensation unit 1004. The variable capacity unit 115 includes binary capacitive elements 1005a, 1005b, 1005c, and 1005d connected in parallel and switches 1006 connected to the individual capacitive elements, in the case of 4-bit control, for example. According to the 4-bit control value, the switches 1006 connected to the individual binary capacitive elements are selectively turned on. As a result, a parallel capacity value varies.

Figure 11:
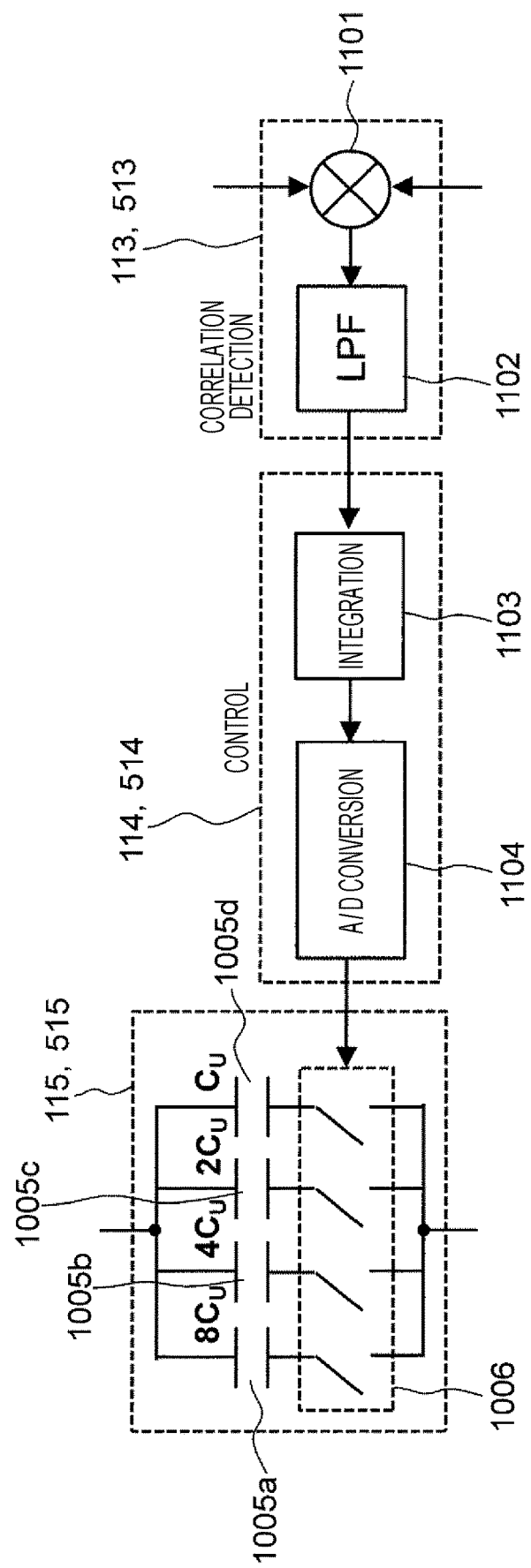
FIG. 11 is a second diagram specifically illustrating configurations of a correlation detection unit, a control unit, and a variable capacity unit of an acceleration sensor according to the present invention.

FIG. 11 illustrates one example of the correlation detection unit 113 (513), the control unit 114 (514), and the variable capacity unit 115 (515a and 515b) applied in the second embodiment (sixth embodiment). The correlation detection unit 113 can be realized by an analog multiplier 1101 and an analog low-pass filter 1102 connected to an output thereof. In addition, the control unit 114 can be realized by an analog integrator 1103 and an A/D converter 1104 connected to an output thereof. The phase compensation unit 1004 of FIG. 10 may be inserted after the A/D converter 1104 and stability of the servo control may be increased. The variable capacity unit 115 is controlled by a digital value of an output of the A/D converter 1104 or an output of the phase compensation unit 1004. The variable capacity unit 115 is the same as that in FIG. 10.

Figure 12:
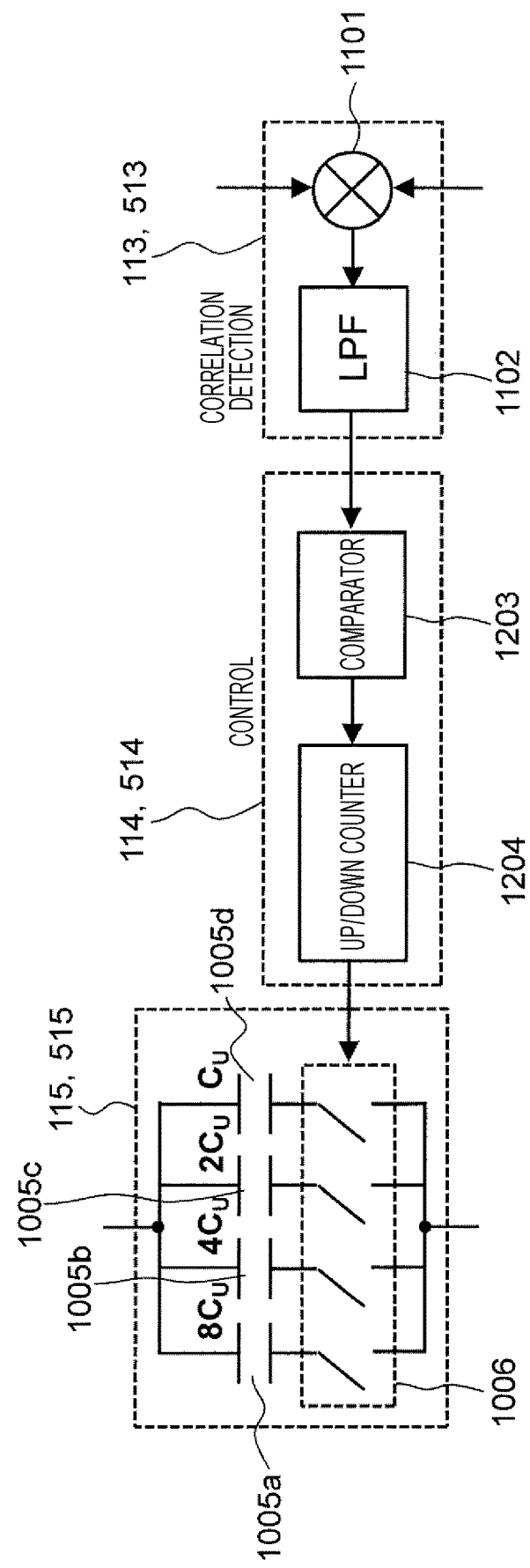
FIG. 12 is a third diagram specifically illustrating configurations of a correlation detection unit, a control unit, and a variable capacity unit of an acceleration sensor according to the present invention.

FIG. 12 illustrates another example of the correlation detection unit 113 (513), the control unit 114 (514), and the variable capacity unit 115 (515a and 515b) applied in the second embodiment (sixth embodiment). Similarly to FIG. 11, the correlation detection unit 113 can be realized by the analog multiplier 1101 and the analog low-pass filter 1102 connected to the output thereof. In addition, the control unit 114 can be realized by a comparator 1203 and an up/down counter 1204 connected to an output thereof. Here, the comparator 1203 executes a function of a 1-bit A/D converter and the up/down counter 1204 executes a function of a digital integrator. However, because a servo value is quantized with 1 bit by the comparator 1203, responsiveness and stability of an MEMS capacity compensation loop are inferior to those in the configurations of FIGS. 10 and 11. Instead, because both the comparator and the up/down counter are simple circuits, a circuit design is facilitated. The variable capacity unit 115 is controlled by a digital value (count value) of an output of the up/down counter. The variable capacity unit 115 is the same as that in FIG. 10.

Figure 13:
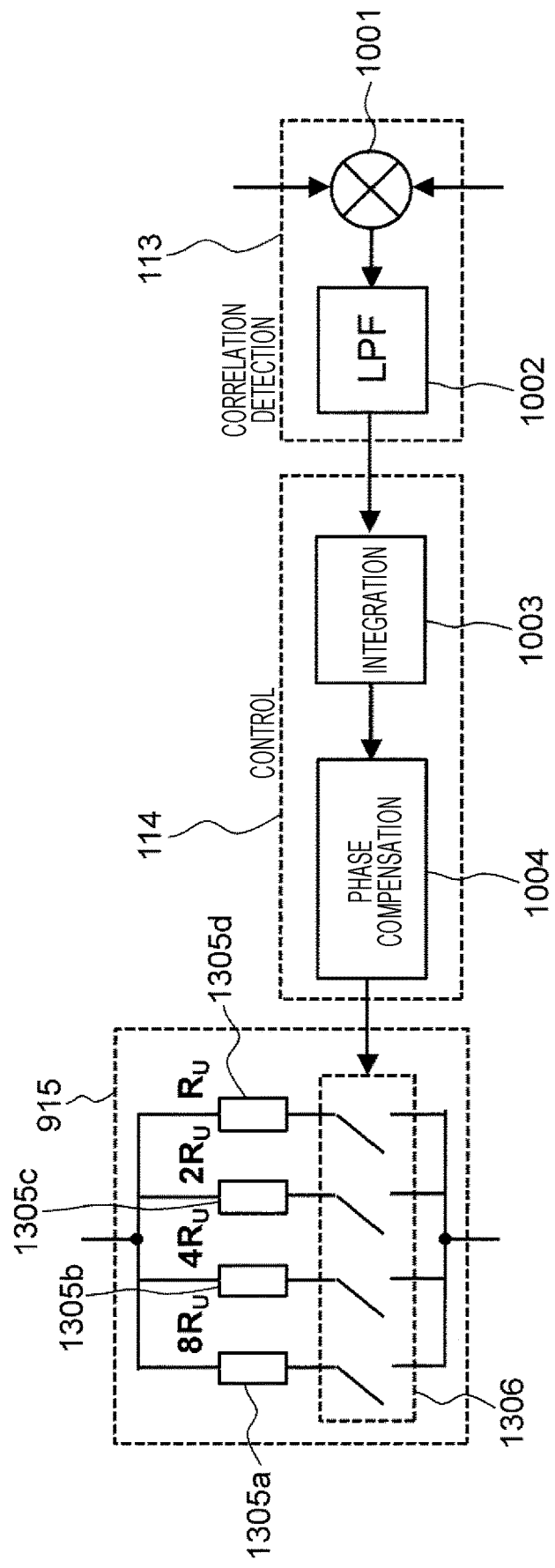
FIG. 13 is a fourth diagram specifically illustrating configurations of a correlation detection unit, a control unit, and a variable resistance unit of an acceleration sensor according to the present invention.
Figure 14:
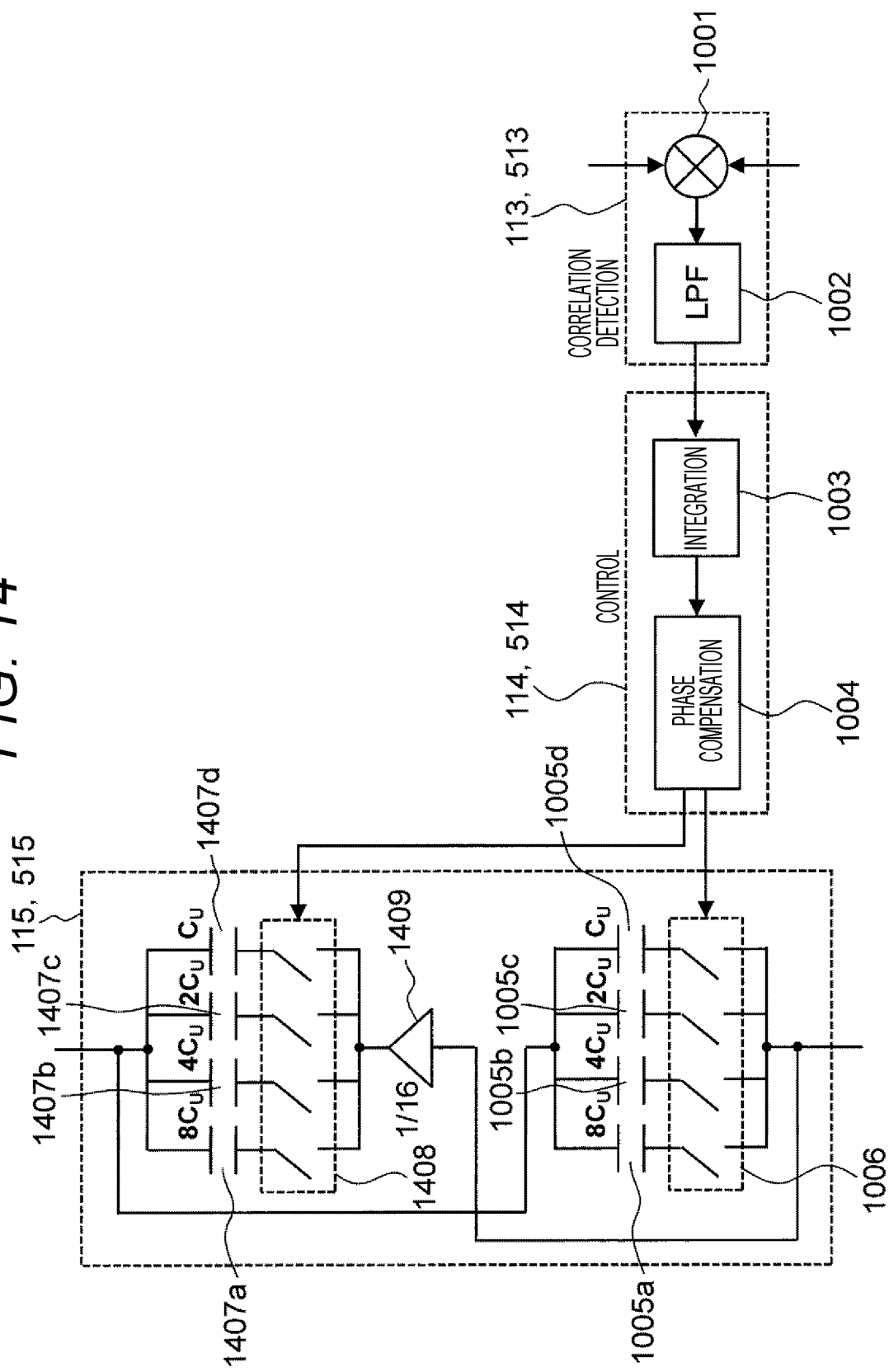
FIG. 14 is a fifth diagram specifically illustrating configurations of a correlation detection unit, a control unit, and a variable capacity unit of an acceleration sensor according to the present invention.
Figure 15:
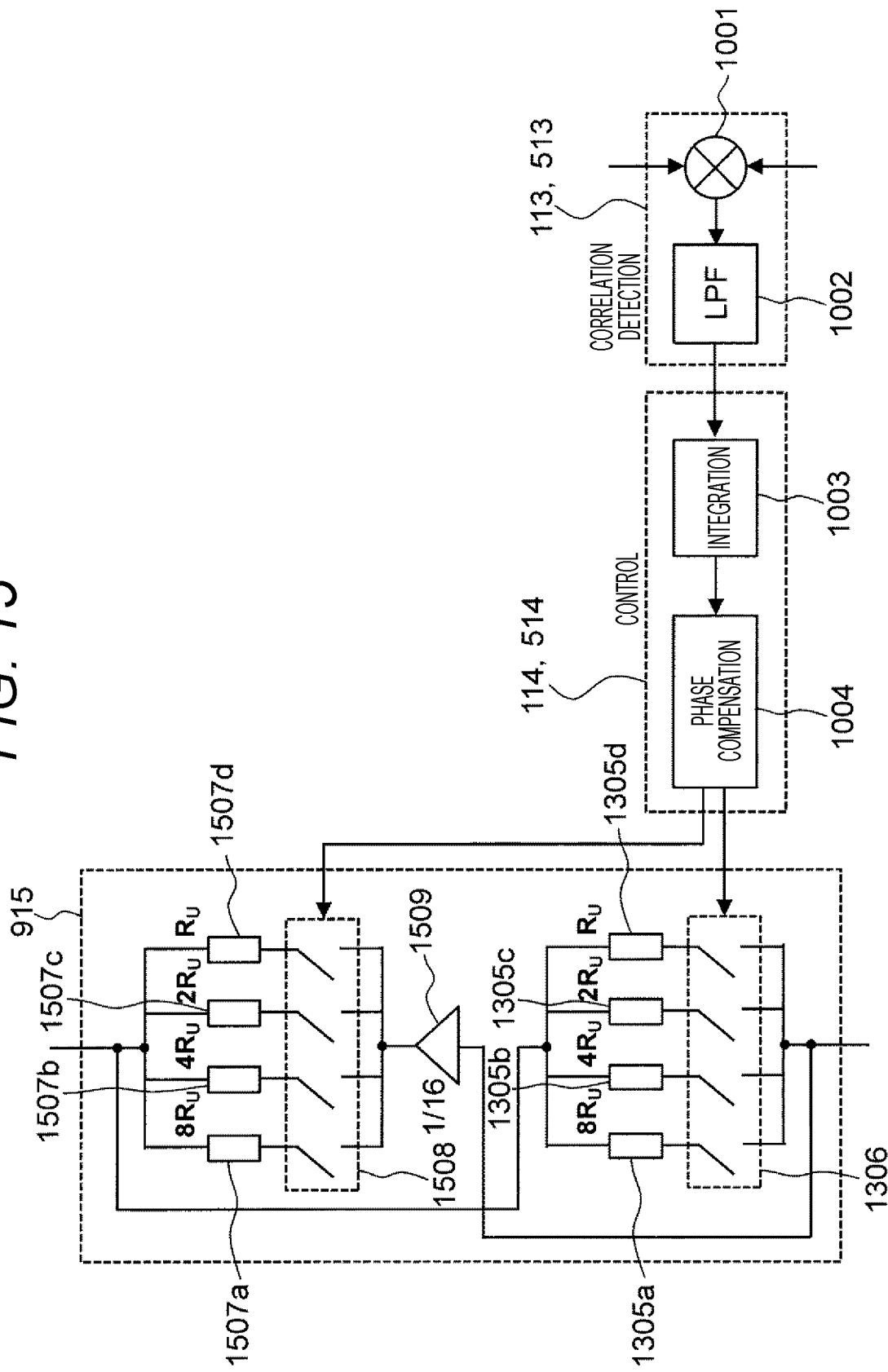
FIG. 15 is a sixth diagram specifically illustrating configurations of a correlation detection unit, a control unit, and a variable resistance unit of an acceleration sensor according to the present invention.

FIG. 13 illustrates one example of the correlation detection unit 113, the control unit 114, and the variable resistance unit 915 applied in the ninth embodiment. The correlation detection unit 113 can be realized by the digital multiplier 1001 and the digital low-pass filter 1002 connected to the output thereof. In addition, the control unit 114 can be realized by the digital integrator 1003 and the phase compensation unit 1004 connected to the output thereof. The phase compensation unit 1004 includes a differentiation (or difference) operation, generates a zero point to advance a phase by the differentiation (or difference) operation, and stabilizes servo control. The variable resistance unit 915 is controlled by a digital value of an output of the phase compensation unit 1004. The variable resistance unit 915 includes binary resistive elements 1305a, 1305b, 1305c, and 1305d connected in parallel and switches 1306 connected to the individual capacitive elements, in the case of 4-bit control, for example. According to the 4-bit control value, the switches 1306 connected to the individual binary resistive elements are selectively turned on. As a result, a parallel resistance value varies.

Figure 16:
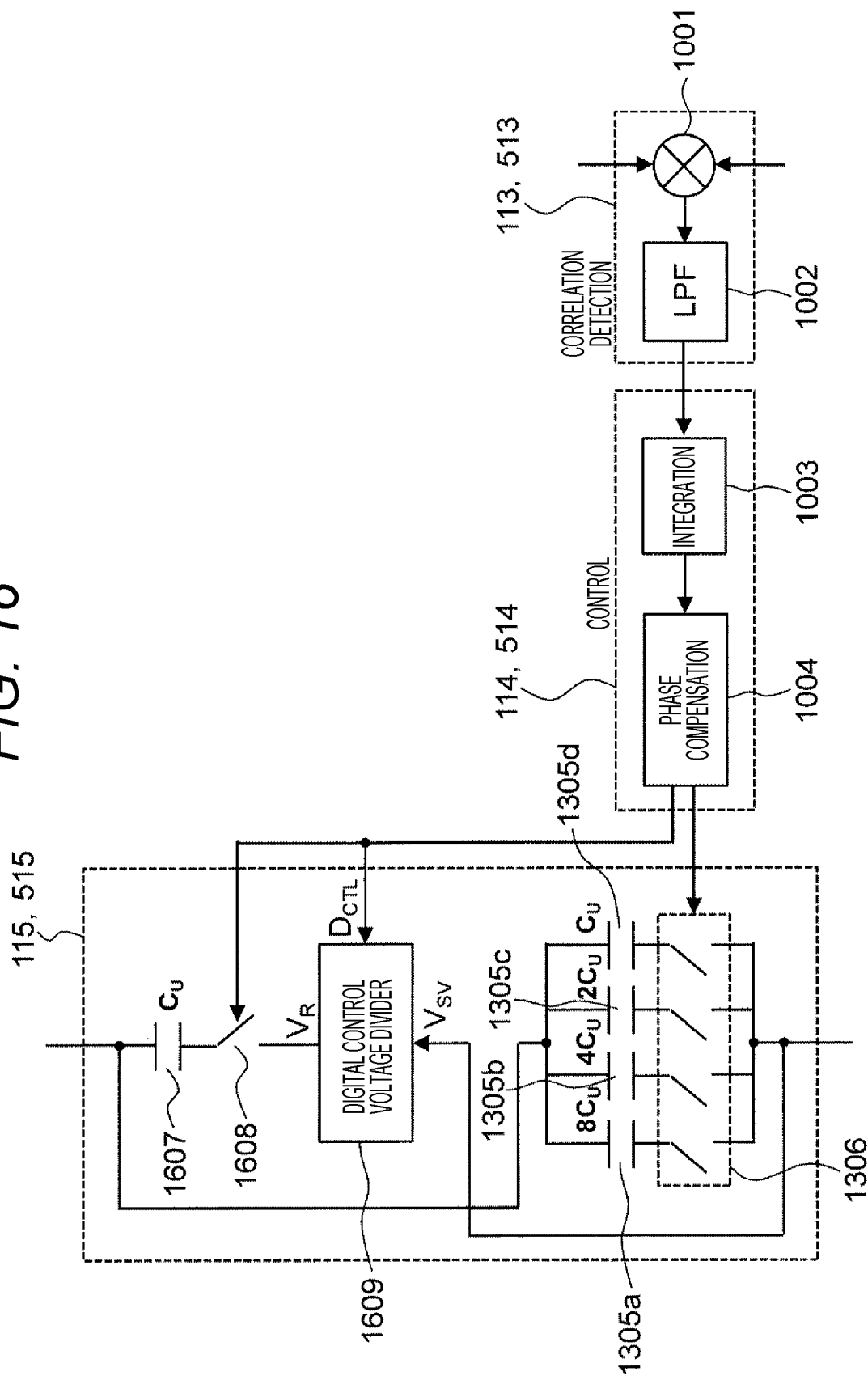
FIG. 16 is a seventh diagram specifically illustrating configurations of a correlation detection unit, a control unit, and a variable capacity unit of an acceleration sensor according to the present invention.
Figure 17:
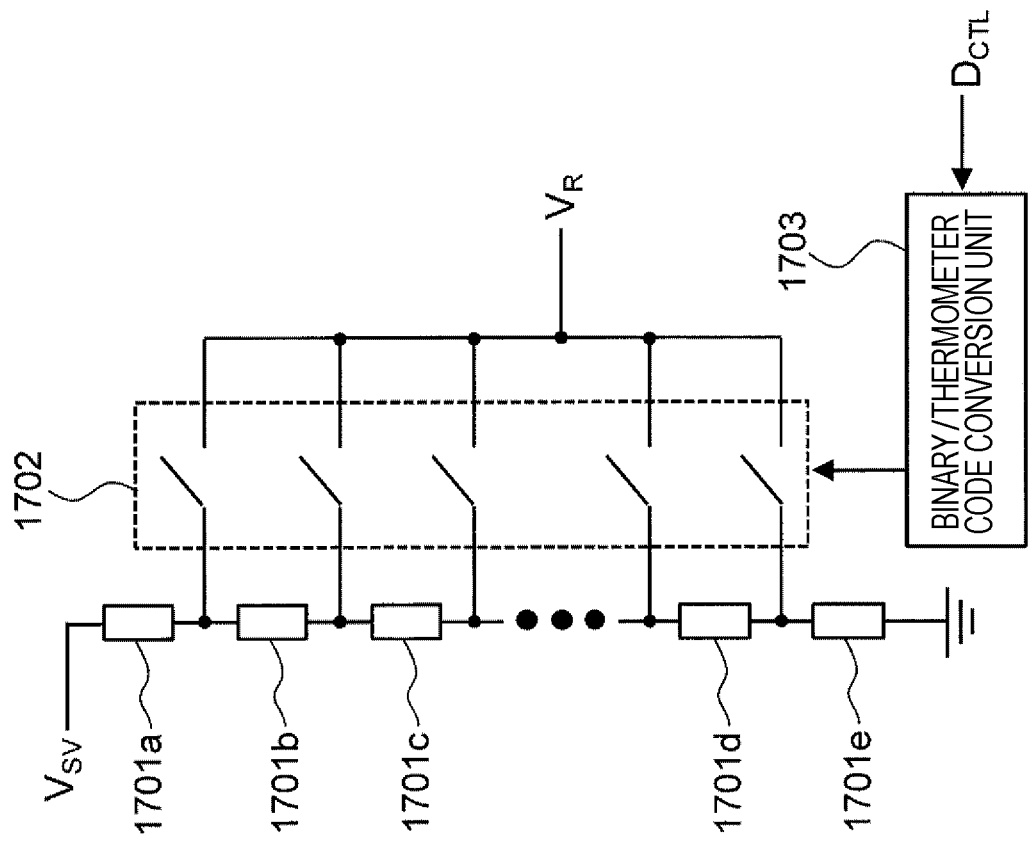
FIG. 17 is a diagram illustrating a configuration example of a digital control voltage divider in FIG. 16.

FIG. 17 is a diagram illustrating a configuration example of a digital control voltage divider in FIG. 16.

Figure 18:
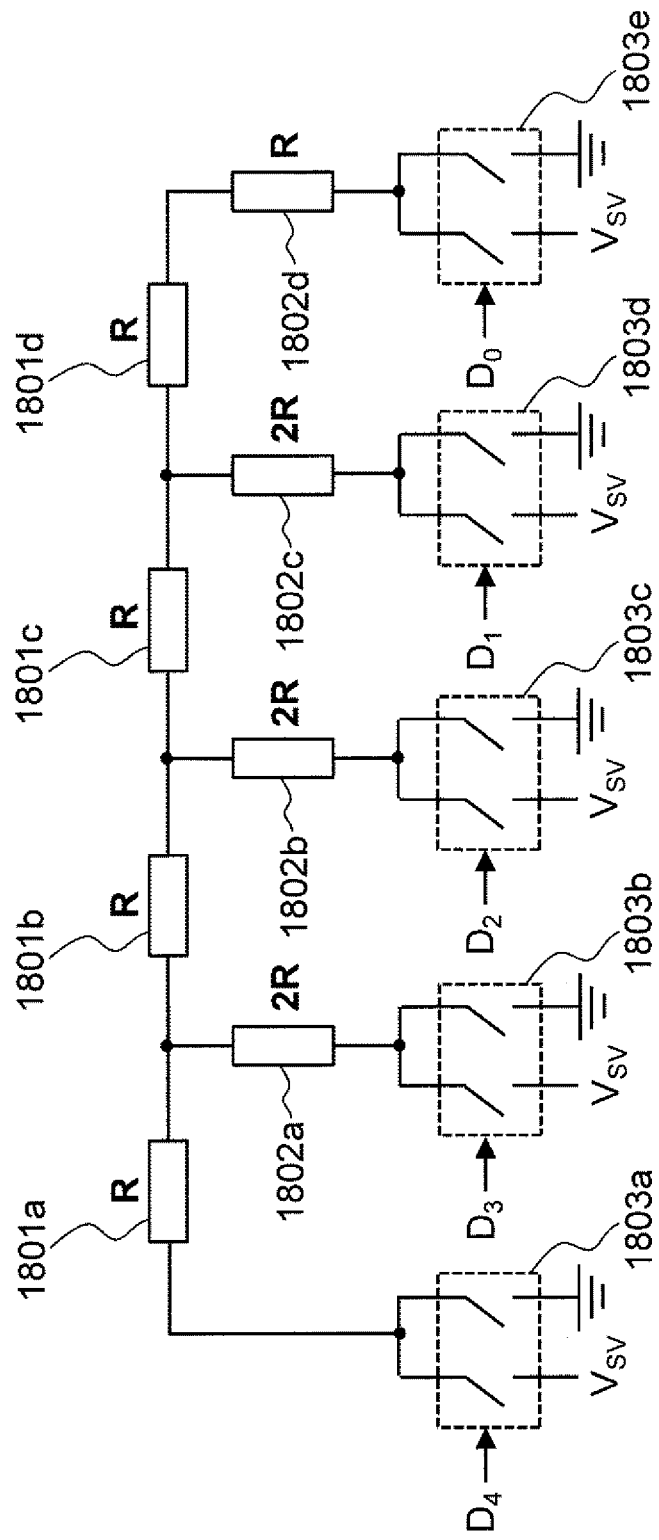
FIG. 18 is a diagram illustrating another configuration example of a digital control voltage divider in FIG. 16.

FIG. 18 is a diagram illustrating another configuration example of the digital control voltage divider in FIG. 16.

Figure 19:
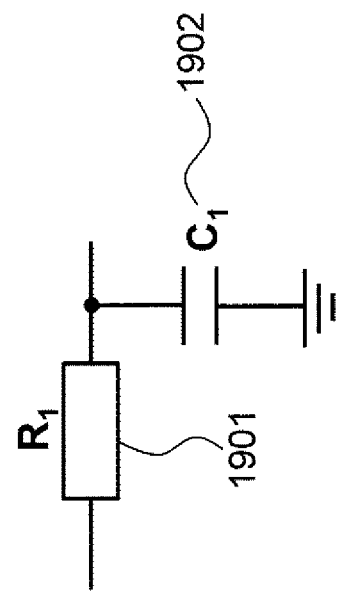
FIG. 19 is a diagram illustrating a configuration example of a delay unit of an acceleration sensor according to the present invention.

FIG. 19 is a diagram illustrating a configuration example of a delay unit of an acceleration sensor according to the present invention.

Figure 20:
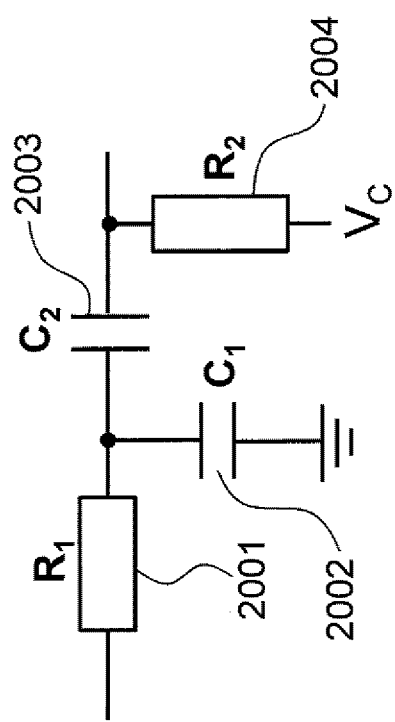
FIG. 20 is a diagram illustrating another configuration example of a delay unit of an acceleration sensor according to the present invention.

FIG. 20 is a diagram illustrating another configuration example of the delay unit of the acceleration sensor according to the present invention.

Figure 21:
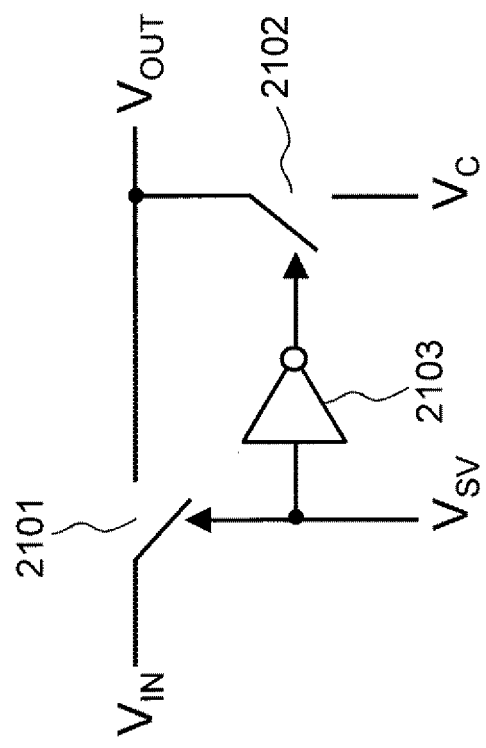
FIG. 21 is a diagram illustrating a configuration example of an analog multiplier in a correlation detection unit of an acceleration sensor according to the present invention.

FIG. 21 is a diagram illustrating a configuration example of an analog multiplier in a correlation detection unit of the acceleration sensor according to the present invention.

Figure 22:
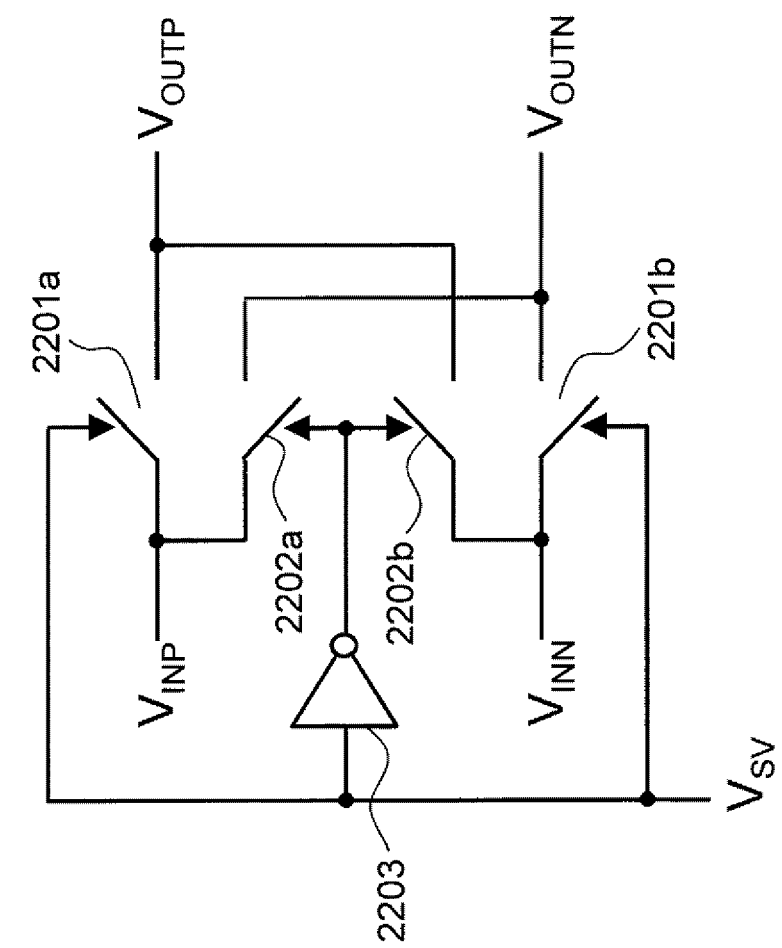
FIG. 22 is a diagram illustrating another configuration example of an analog multiplier in a correlation detection unit of an acceleration sensor according to the present invention.

FIG. 22 is a diagram illustrating another configuration example of the analog multiplier in the correlation detection unit of the acceleration sensor according to the present invention.

REFERENCE SIGNS LIST 100 weight (movable electrode portion)
101a, 101b capacitor pair for signal detection
102a, 102b capacitor pair for servo control
103 charge amplifier
103a operational amplifier
103b feedback capacitor
103c feedback resistor
104 amplifier
105 analog filter
106 A/D converter
107 demodulator
108 servo control unit
109 1-bit quantizer
110 1-bit D/A converter
111 digital low-pass filter
112a, 112b driver for capacitor pair for signal detection
113 correlation detection unit
114 control unit
115 variable capacity unit
116 driver for variable capacity
417 delay unit
500a, 500b weight (movable electrode portion)
501a, 501b capacitor pair for positive-side signal detection
501c, 501d capacitor pair for negative-side signal detection
502a, 502b capacitor pair for positive-side servo control
502c, 502d capacitor pair for negative-side servo control
503 differential charge amplifier
503a, 503d operational amplifier
503b, 503e feedback capacitor
503c, 503f feedback resistor
504 differential amplifier
505 differential analog filter
506 differential A/D converter
507 demodulator
508 servo control unit
509 1-bit quantizer
510 1-bit D/A converter
511 digital low-pass filter
512a, 512b driver for capacitor pair for signal detection
513 correlation detection unit
514 control unit
515a, 515b variable capacity unit
516 driver for variable capacity
717 delay unit
818 inverter
904 amplifier
904a operational amplifier
904b input resistor
904c feedback resistor
915 variable resistance unit
916 driver
917 delay unit
1001 digital multiplier
1002 digital low-pass filter
1003 digital integrator
1004 phase compensation unit
1005a, 1005b, 1005c, 1005d binary capacitive element
1006 switch
1101 analog multiplier
1102 analog low-pass filter
1103 analog integrator
1104 A/D converter
1203 comparator
1204 up/down counter
1305a, 1305b, 1305c, 1305d binary resistive element
1306 switch

The invention claimed is:

1. A MEMS capacitive acceleration sensor, comprising: a first MEMS capacitor pair for signal detection;
a second MEMS capacitor pair for servo control in which one electrode of each said second MEMS capacitor is connected to one electrode of each capacitor in the first MEMS capacitor pair and to which a servo voltage to generate force in a direction reverse to a detection signal of acceleration by the first MEMS capacitor pair is applied, wherein the electrodes of the first MEMS capacitor pair and the second MEMS capacitor pair are connected to each other and form one weight;
a charge amplifier which is connected to the weight and converts a charge change on the weight into a voltage change;
an A/D converter which digitizes a voltage change signal of an output of the charge amplifier;
a 1-bit quantizer which quantizes a servo value to generate force in a direction reverse to displacement of the weight by the acceleration, generated from an output of the A/D converter, with 1 bit;
a 1-bit D/A converter which converts an output of the 1-bit quantizer into an analog servo voltage and applies the analog servo voltage to the second MEMS capacitor pair;
a correlation detection unit which outputs a signal proportional to a difference in capacitance values in the second MEMS capacitor pair, on the basis of the output of the A/D converter and the output of the 1-bit quantizer;

a control unit which outputs a capacitance control value to cancel an influence due to the difference in the capacitance values on an input node of the charge amplifier, on the basis of the output of the correlation detection unit; and a variable capacitance unit which is inserted between an output node of a driver outputting the output of the 1-bit quantizer at a voltage amplitude that is more suppressed than an amplitude of the servo voltage and the input node of the charge amplifier and of which a capacitance is controlled according to the capacitance control value of the output of the control unit.

2. The acceleration sensor according to claim 1, wherein the correlation detection unit outputs the signal proportional to the difference in the capacitance values in the second MEMS capacitor pair, on the basis of the output of the charge amplifier in place of the output of the A/D converter and the output of the 1-bit quantizer.

3. The acceleration sensor according to claim 2, wherein the correlation detection unit is configured using an analog multiplier and an analog low-pass filter by an input unit, the control unit receives the output of the correlation detection unit from the input unit, and is configured using an analog integrator and an A/D converter, and the variable capacitance unit is configured using binary capacitive elements connected in parallel and switches controlled according to a control value from the control unit.

4. The acceleration sensor according to claim 2, wherein the correlation detection unit is configured using an analog multiplier and an analog low-pass filter by an input unit, the control unit receives the output of the correlation detection unit from the input unit, and is configured using a comparator executing the function of the 1-bit A/D converter and an up/down counter executing the function of a digital integrator, and the variable capacitance unit is configured using binary capacitive elements connected in parallel and switches controlled according to a control value from the control unit.

5. The acceleration sensor according to claim 1, wherein the correlation detection unit outputs the signal proportional to the difference in the capacitance values in the second MEMS capacitor pair, on the basis of an output of an amplifier amplifying an output signal of the charge amplifier in place of the output of the A/D converter and the output of the 1-bit quantizer.

6. The acceleration sensor according to claim 1, wherein the variable capacitance unit is inserted between an output node of a delay unit connected to the driver and the input node of the charge amplifier and the capacitance of the variable capacitance unit is controlled according to the capacitance control value of the output of the control unit wherein the delay unit simulates a response delay of the 1-bit D/A converter.

7. The acceleration sensor according to claim 1, wherein the correlation detection unit is configured using a digital multiplier and a digital low-pass filter by an input unit, the control unit receives the output of the correlation detection unit from the input unit, and is configured using a digital integrator and a phase compensation unit generating a zero point to advance a phase by a differentiation or difference operation and stabilizing servo control, and the variable capacitance unit is configured using binary capacitive elements connected in parallel and switches controlled according to a control value from the control unit.

8. A MEMS capacitive acceleration sensor, comprising:
a first MEMS capacitor pair for signal detection;
a second MEMS capacitor pair for servo control in which one electrode of each said second MEMS capacitor is connected to one electrode of each capacitor in the first capacitor pair to configure a positive-side weight and to which a servo voltage is applied to generate force in a direction opposite to the acceleration;
a third MEMS capacitor pair for signal detection;
a fourth MEMS capacitor pair for servo control in which one electrode of each capacitor is connected to one electrode of each capacitor in the third capacitor pair to configure a negative-side weight and to which a servo voltage is applied to generate force in a direction opposite to the acceleration;
a first charge amplifier which is connected to the positive-side weight and converts a charge change on the positive-side weight into a voltage change;
a second charge amplifier which is connected to the negative-side weight and converts a charge change on the negative-side weight into a voltage change;
an A/D converter which digitizes voltage change signals of differential outputs of the first and second charge amplifiers;
a 1-bit quantizer which quantizes a servo value to generate force in a direction opposite to the displacement of the weight by the acceleration, generated from an output of the A/D converter, with 1 bit;
a 1-bit D/A converter which converts an output of the 1-bit quantizer into an analog servo voltage and applies the analog servo voltage to the second MEMS capacitor pair and the fourth MEMS capacitor pair;
a correlation detection unit which outputs a signal proportional to a difference in capacitance values in the second MEMS capacitor pair and the fourth MEMS capacitor pair, on the basis of the output of the A/D converter and the output of the 1-bit quantizer;
a control unit which outputs differential capacitance control values to cancel an influence due to the difference in the capacitance values on input nodes of the first and second charge amplifiers, on the basis of the output of the correlation detection unit;
a first variable capacitance unit which is inserted between an output node of a driver outputting the output of the 1-bit quantizer at a voltage amplitude that is more suppressed than the amplitude of the servo voltage and the input node of the first charge amplifier and of which a capacitance is controlled according to the differential capacitance control values of the output of the control unit; and
a second variable capacitance unit which is inserted between the output node of the driver outputting the output of the 1-bit quantizer at a voltage amplitude that is more suppressed than the amplitude of the servo voltage and the input node of the second charge amplifier and of which a capacitance is controlled according to the differential capacitance control values of the output of the control unit.

9. The acceleration sensor according to claim 8, wherein the correlation detection unit outputs the signal proportional to the difference in the capacitance values in the second MEMS capacitor pair and the fourth MEMS capacitor pair, on the basis of the output of the first or second charge amplifier in place of the output of the A/D converter and the output of the 1-bit quantizer.

10. The acceleration sensor according to claim 9, wherein
the correlation detection unit is configured using an analog multiplier and an analog low-pass filter by an input unit,
the control unit receives the output of the correlation detection unit from the input unit, and is configured using an analog integrator and an A/D converter, and
the variable capacitance unit is configured using binary capacitive elements connected in parallel and switches controlled according to a control value from the control unit.

11. The acceleration sensor according to claim 9, wherein
the correlation detection unit is configured using an analog multiplier and an analog low-pass filter by an input unit,
the control unit receives the output of the correlation detection unit from the input unit, and is configured using a comparator executing a function of the 1-bit A/D converter and an up/down counter executing a function of a digital integrator, and
the variable capacitance unit is configured using binary capacitive elements connected in parallel and switches controlled according to a control value from the control unit.

12. The acceleration sensor according to claim 8, wherein
the first variable capacitance unit is inserted between an output node of a delay unit connected to the driver outputting the output of the 1-bit quantizer, wherein the delay unit simulates a response delay of the 1-bit D/A converter, and wherein the input node of the first charge amplifier and the capacitance of the first variable capacitance unit is controlled according to the differential capacitance control values of the output of the control unit; and
the second variable capacitance unit is inserted between the output node of the delay unit and the input node of the second charge amplifier, wherein the capacitance of the second variable capacitance unit is controlled according to the differential capacitance control values of the output of the control unit.

13. The acceleration sensor according to claim 8, wherein
the control unit outputs a common capacitance control value to cancel the influence due to the difference in the capacitance values on the input nodes of the first and second charge amplifiers, on the basis of the output of the correlation detection unit, and
the second variable capacitance unit is inserted between an output node of an inverter connected to the driver outputting the output of the 1-bit quantizer and the input node of the second charge amplifier, wherein capacitance of the second variable capacitance unit is controlled according to the capacitance control value of the output of the control unit.

14. The acceleration sensor according to claim 8, wherein
the correlation detection unit is configured using a digital multiplier and a digital low-pass filter by an input unit,
the control unit receives the output of the correlation detection unit from the input unit, and is configured using a digital integrator and a phase compensation unit generating a zero point to advance a phase by a differentiation or difference operation and stabilizing servo control, and
the variable capacitance unit is configured using binary capacitive elements connected in parallel and switches controlled according to a control value from the control unit.

15. An MEMS capacitive acceleration sensor, comprising:
a first MEMS capacitor pair for signal detection;
a second MEMS capacitor pair for servo control in which one electrode of each said second MEMS capacitor is connected to one electrode of each capacitor in the first MEMS capacitor pair and to which a servo voltage to generate force in a direction reverse to a detection signal of acceleration by the first MEMS capacitor pair is applied, wherein the electrodes of the first MEMS capacitor pair and the second MEMS capacitor pair are connected to each other and form one weight;
a charge amplifier which is connected to the weight and converts a charge change on the weight into a voltage change;
an A/D converter which digitizes a voltage change signal of an output of the charge amplifier;
a 1.5-bit quantizer or a multi-bit quantizer which quantizes a servo value to generate force in a direction reverse to displacement of the weight by the acceleration, generated from an output of the A/D converter;
a 1.5-bit D/A converter or a multi-bit D/A converter which converts an output of the quantizer into an analog servo voltage and applies the analog servo voltage to the second MEMS capacitor pair;
a correlation detection unit which outputs a signal proportional to a difference in capacitance values in the second MEMS capacitor pair, on the basis of the output of the A/D converter and the output of the quantizer;
a control unit which outputs a capacitance control value to cancel an influence due to the difference in the capacitance values on an input node of the charge amplifier, on the basis of the output of the correlation detection unit; and
a variable capacitance unit which is inserted between an output node of a driver outputting the output of the quantizer at a voltage amplitude that is more suppressed than an amplitude of the servo voltage and the input node of the charge amplifier and of which a capacitance is controlled according to the capacitance control value of the output of the control unit.

* * * * *